United States Patent
Zheng et al.

(10) Patent No.: US 12,130,978 B2
(45) Date of Patent: Oct. 29, 2024

(54) DISPLAY MODULE, ELECTRONIC DEVICE, AND ELECTRONIC DEVICE CONTROL METHOD

(71) Applicant: Huawei Technologies Co., Ltd., Shenzhen (CN)

(72) Inventors: Zhiwei Zheng, Osaka (JP); Yisuei Liao, Shenzhen (CN); Wei Bai, Dongguan (CN); Meng Kang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/306,535

(22) Filed: Apr. 25, 2023

(65) Prior Publication Data

US 2023/0266840 A1    Aug. 24, 2023

Related U.S. Application Data

(60) Division of application No. 17/403,270, filed on Aug. 16, 2021, which is a continuation of application No. PCT/CN2020/112716, filed on Aug. 31, 2020.

(30) Foreign Application Priority Data

Feb. 14, 2020   (CN) .......................... 202010093656.8

(51) Int. Cl.
  *G06F 3/041*   (2006.01)
  *G06F 3/16*    (2006.01)
(52) U.S. Cl.
  CPC ........ *G06F 3/04142* (2019.05); *G06F 3/0416* (2013.01); *G06F 3/165* (2013.01); *G06F 2203/04105* (2013.01)

(58) Field of Classification Search
  CPC .... G06F 3/04142; G06F 3/0416; G06F 3/165; G06F 2203/04105
  See application file for complete search history.

(56) References Cited

U.S. PATENT DOCUMENTS

| | | | |
|---|---|---|---|
| 2013/0113737 A1* | 5/2013 | Shiba | ..................... G06F 3/0482 345/173 |
| 2017/0185211 A1 | 6/2017 | Lu | |
| 2017/0285858 A1 | 10/2017 | Kursula | |
| 2018/0039362 A1* | 2/2018 | Liu | ........................ H10K 59/40 |
| 2018/0040674 A1 | 2/2018 | Du | |

(Continued)

FOREIGN PATENT DOCUMENTS

| | | |
|---|---|---|
| CN | 104850351 A | 8/2015 |
| CN | 104917890 A | 9/2015 |

(Continued)

*Primary Examiner* — Towfiq Elahi
(74) *Attorney, Agent, or Firm* — Conley Rose, P.C.

(57) ABSTRACT

A display module, an electronic device, and an electronic device control method, and relate to the field of display technologies. A pressure sensor is integrated into a layered structure of the display module. The display module includes an active area and an inactive area. The inactive area includes the pressure sensor. The pressure sensor includes one or more pressure sensitive resistors, at least one pressure sensitive resistor is disposed at a same layer as a semiconductor active layer of the active area, and the at least one pressure sensitive resistor is made of a same material as the semiconductor active layer.

20 Claims, 26 Drawing Sheets

(56) References Cited

U.S. PATENT DOCUMENTS

| | | |
|---|---|---|
| 2018/0052350 A1 | 2/2018 | Zhao |
| 2018/0067587 A1 | 3/2018 | Yao |
| 2018/0120977 A1 | 5/2018 | Shim |
| 2018/0129331 A1 | 5/2018 | Zhou |
| 2018/0130543 A1 | 5/2018 | Zhu |
| 2018/0150175 A1 | 5/2018 | Li |
| 2019/0004634 A1 | 1/2019 | Liu |
| 2019/0227629 A1* | 7/2019 | Grant ................. G06F 3/04886 |
| 2019/0317621 A1 | 10/2019 | Lee |
| 2019/0391692 A1 | 12/2019 | Park |

FOREIGN PATENT DOCUMENTS

| | | |
|---|---|---|
| CN | 105487273 A | 4/2016 |
| CN | 107102466 A | 8/2017 |
| CN | 107104133 A | 8/2017 |
| CN | 107134462 A | 9/2017 |
| CN | 107221537 A | 9/2017 |
| CN | 107340913 A | 11/2017 |
| CN | 107340914 A | 11/2017 |
| CN | 107340920 A | 11/2017 |
| CN | 107422514 A | 12/2017 |
| CN | 107491217 A | 12/2017 |
| CN | 107526473 A | 12/2017 |
| CN | 107589870 A | 1/2018 |
| CN | 107844217 A | 3/2018 |
| CN | 207530875 U | 6/2018 |
| CN | 108459794 A | 8/2018 |
| CN | 108693993 A | 10/2018 |
| CN | 109917941 A | 6/2019 |
| CN | 110381203 A | 10/2019 |
| CN | 110647254 A | 1/2020 |
| EP | 2631056 A3 | 4/2014 |

* cited by examiner

DISPLAY MODULE, ELECTRONIC DEVICE, AND ELECTRONIC DEVICE CONTROL METHOD

CROSS-REFERENCE TO RELATED APPLICATIONS

This application is a divisional application of U.S. patent application Ser. No. 17/403,270, filed on Aug. 16, 2021, which is a continuation of International Patent Application No. PCT/CN2020/112716, filed on Aug. 31, 2020, which claims priority to Chinese Patent Application No. 202010093656.8, filed on Feb. 14, 2020. All of the aforementioned patent applications are hereby incorporated by reference in their entireties.

TECHNICAL FIELD

This application relates to the field of display technologies, and in particular, to a display module, an electronic device, and an electronic device control method.

BACKGROUND

When being used for a long time, a mechanical key used on an electronic device may be mechanically worn, and even have a potential failure risk. In addition, the mechanical key needs to occupy specific space, and needs to protrude from the device. This is not conducive to implementing integrated design of the device. Especially when the device is in a form of a mobile terminal having a waterfall screen, the mechanical key is inevitably canceled. Although a solution of installing a separate external pressure sensor can be used to resolve the foregoing problems, because the external pressure sensor needs to be fastened to a middle frame by using a glue material in extremely limited space, the external pressure sensor may fall off during a drop, resulting in a high reliability risk. In addition, a difference in assembly results in poor consistency between different devices and additional costs.

SUMMARY

Embodiments of this application provide a display module, an electronic device, and an electronic device control method. Therefore, a pressure sensor can be integrated into a layered structure of the display module, to improve integrity and reliability of a product.

To achieve the foregoing objectives, the following technical solutions are used in the embodiments of this application.

According to a first aspect of the embodiments of this application, a display module is provided, including an active area and an inactive area. The inactive area includes a pressure sensor. The pressure sensor includes one or more pressure sensitive resistors, at least one pressure sensitive resistor is disposed at a same layer as a semiconductor active layer of the active area, and the at least one pressure sensitive resistor is made of a same material as the semiconductor active layer. For example, the semiconductor active layer may be made of a material such as silicon (Si) or a metal oxide. Because the semiconductor active layer has a pressure-sensitive feature, namely, a feature of changing resistance after being pressed, the pressure sensitive resistor of the pressure sensor is located at the semiconductor active layer of the display module. In this way, the pressure sensitive resistor of the pressure sensor and a plurality of pressure sensitive resistors in the active area may be made at the same time each material layer of the display module is made, and the at least one pressure sensitive resistor is made of the same material and at the same layer as the semiconductor active layer of the active area, to save space. The pressure sensor is synchronously formed in a manufacturing process of the display module without being fastened by using a glue material, so that integrity and reliability of a product are improved.

In a possible design, based on a circuit design requirement of the pressure sensor, the pressure sensor further includes another resistor other than the pressure sensitive resistor, and the other resistor is at a same layer as another material layer other than the semiconductor active layer in the display module. The other material layer herein includes a conducting wire layer or a pixel electrode layer.

In a possible design, an example structure of the pressure sensor is provided. The pressure sensor includes a first resistor, a second resistor, a third resistor, and a fourth resistor. A first end of the first resistor is coupled to a second end of the fourth resistor, and a second end of the first resistor is coupled to a first end of the second resistor. A second end of the second resistor is coupled to a first end of the third resistor, and a second end of the third resistor is coupled to a first end of the fourth resistor. The first end of the first resistor, the first end of the second resistor, the first end of the third resistor, and the first end of the fourth resistor are separately coupled to a pressure controller through a conducting wire. The pressure controller is configured to input a first voltage signal to the first end of the first resistor, input a second voltage signal to the first end of the third resistor, receive a third voltage signal output by the first end of the second resistor, receive a fourth voltage signal output by the first end of the fourth resistor, obtain a resistance variation of the pressure sensor based on the third voltage signal and the fourth voltage signal, and calculate, based on the resistance variation of the pressure sensor, pressure applied to the pressure sensor. For example, the first resistor, the second resistor, the third resistor, and the fourth resistor meet the following relationship: R1/R2=R4/R3, where R1 is resistance of the first resistor, R2 is resistance of the second resistor, R3 is resistance of the third resistor, and R4 is resistance of the fourth resistor.

In a possible design, to increase an amplitude of an output signal of the sensor, so as to improve sensitivity of the sensor, for projections of the first resistor, the second resistor, the third resistor, and the fourth resistor on a plane on which a surface of the display module is located, a center distance between the projection of the first resistor and the projection of the third resistor is less than or equal to a first distance threshold, and a center distance between the projection of the second resistor and the projection of the fourth resistor is less than or equal to a second distance threshold, a center distance between the projection of the first resistor and the projection of the second resistor is greater than or equal to a third distance threshold, or a center distance between the projection of the first resistor and the projection of the fourth resistor is greater than or equal to a third distance threshold, and a center distance between the projection of the third resistor and the projection of the second resistor is greater than or equal to a fourth distance threshold, or a center distance between the projection of the third resistor and the projection of the fourth resistor is greater than or equal to a fourth distance threshold. The third distance threshold is greater than the first distance threshold, the third distance threshold is greater than the second distance threshold, the fourth distance threshold is greater than the first distance threshold, and the fourth distance threshold is greater than the second distance threshold.

In a possible design, to maximize a variation difference of the pressure sensitive resistor before and after pressing is performed, so as to improve sensitivity of the sensor, the first resistor, the second resistor, the third resistor, and the fourth resistor use a same pattern, or the first resistor and the third resistor use a same pattern, and the second resistor and the fourth resistor use a same pattern. In the following examples, several resistor patterns are provided. For example, Manner 1: a resistance wire used for the pressure sensitive resistor included in the pressure sensor sequentially extends in orthogonal directions. Manner 2: a resistance wire used for the pressure sensitive resistor included in the pressure sensor is helical. Manner 3: the pressure sensitive resistor included in the pressure sensor is formed by connecting straight conducting wire segments in series, and an included angle between adjacent straight conducting wire segments is a fixed value. A common feature of the resistor patterns provided in Manner 2 and Manner 3 lies in that there are relatively large components along a symmetry axis (or an approximate symmetry axis) of the resistor pattern and two orthogonal directions of the resistor pattern. When the pressure sensitive resistor uses the pattern, even when an angle between a pressing point and the pressure sensor changes, a total variation of all the resistors can be ensured to be close, so that a signal deviation problem caused by an orientation relationship between the pressing point and the pressure sensor can be eliminated, unidirectional sensitivity of strain can be eliminated, and strain in all directions tends to be uniform.

In a possible design, the inactive area further includes a scanning circuit. The pressure sensor is located on a side, away from the active area, of the scanning circuit. The scanning circuit includes components such as a transistor and a capacitor, and these components generally need to be prepared by using a plurality of material layers. Therefore, the scanning circuit is separately disposed at some of a plurality of layers in the inactive area.

In a possible design, the display module includes at least two pressure sensors, and when the at least two pressure sensors are disposed in an inactive area on a same frame of the display module, two adjacent sensors in the at least two pressure sensors are spaced at a predetermined distance. The spacing distance may be set based on experience. For example, when a plurality of pressure sensors is required to work together, a predetermined distance at which the plurality of pressure sensors is spaced should enable that the pressure sensors can be reached simultaneously within a pressing range.

According to a second aspect, an electronic device control method is provided, and includes inputting a drive signal to a pressure sensor, and collecting a sensor signal output by the pressure sensor, and generating a control signal for a predetermined function based on the sensor signal. Because an electronic device uses the display module provided in the first aspect, technical problems resolved by the method and technical effects implemented by the method are also the same as those described in the first aspect, and details are not described herein again.

In a possible design, generating a control signal for a predetermined function based on the sensor signal includes: determining pressing time of or pressing force on the pressure sensor based on the sensor signal, and generating the control signal for the predetermined function based on the pressing time of or the pressing force on the pressure sensor. In this solution, an electronic device control apparatus may generate different control signals based on different pressing time of or pressing force on the pressure sensor. This enriches a manner of controlling the electronic device.

In a possible design, a display module includes at least two pressure sensors, when the at least two pressure sensors are disposed in an inactive area on a same frame of the display module, two adjacent sensors in the at least two pressure sensors are spaced at a predetermined distance, and generating a control signal for a predetermined function based on the sensor signal includes: generating the control signal for the predetermined function based on sensor signals generated by the at least two pressure sensors. In this solution, the electronic device control apparatus may generate different control signals based on different combinations of sensor signals of a plurality of pressure sensors. This enriches a manner of controlling the electronic device.

In a possible design, before inputting a drive signal to a pressure sensor, and collecting a sensor signal output by the pressure sensor, the method further includes determining a pressure sensor in a predetermined touch area, where the pressure sensor in the predetermined touch area is configured to correspond to the predetermined function. In this solution, a touchscreen is combined with the pressure sensor in this application, and pressure sensors in different touch areas are pre-configured with different functions. After an area in which a touch occurs is located, a function of a pressure sensor in the touch area may be determined.

In a possible design, the predetermined function includes a volume control function, a power key function, or a shortcut key function. In this way, when the predetermined function includes the volume control function, generating the control signal for the predetermined function based on the pressing time of or the pressing force on the pressure sensor includes: generating, based on the pressing time of or the pressing force on the pressure sensor, a control signal for controlling volume increase or decrease. When the predetermined function includes the power key function, when it is determined that pressing time T of the pressure sensor is less than T1, it is determined that the power key function is not responding, when it is determined that the pressing time T of the pressure sensor is greater than T1 but less than T2, a sleep signal is generated, and when it is determined that the pressing time T of the pressure sensor is greater than T3, a power-off or restart signal is generated, where T1<T2<T3. When the predetermined function includes the shortcut key function, generating a control signal for a predetermined function based on the sensor signal includes: generating, based on the sensor signal, an invoking signal for invoking a predetermined application.

According to a third aspect, an electronic device control apparatus is provided, configured to implement the foregoing methods. A test bench control apparatus includes a corresponding module, unit, or means for implementing the foregoing methods. The module, unit, or means may be implemented by hardware, software, or hardware by executing corresponding software. The hardware or the software includes one or more modules or units corresponding to the foregoing functions.

According to a fourth aspect, an electronic device control apparatus is provided, including a processor and a memory. The memory is configured to store computer instructions, and when the processor executes the instructions, the electronic device control apparatus is enabled to perform the method in any one of the foregoing aspects.

According to a fifth aspect, an electronic device control apparatus is provided, including a processor. The processor is configured to, after being coupled to a memory and reading instructions in the memory, perform, according to the instructions, the method according to any one of the foregoing aspects.

According to a sixth aspect, a computer-readable storage medium is provided. The computer-readable storage medium stores instructions. When the instructions are run on a computer, the computer is enabled to perform the method according to any one of the foregoing aspects.

According to a seventh aspect, a computer program product including instructions is provided. When the computer program product runs on a computer, the computer is enabled to perform the method according to any one of the foregoing aspects.

According to an eighth aspect, an electronic device control apparatus (for example, the electronic device control apparatus may be a chip or a chip system) is provided. The electronic device control apparatus includes a processor configured to implement the functions in any one of the foregoing aspects. In a possible design, the electronic device control apparatus further includes a memory. The memory is configured to store program instructions and data that are necessary. When being the chip system, the electronic device control apparatus may include a chip, or may include a chip and another discrete component.

According to a ninth aspect, an electronic device is provided, including the display module provided in the first aspect, and the electronic device control apparatus provided in any one of the foregoing aspects.

For a technical effect brought by any design in the third aspect to the ninth aspect, refer to the technical effects brought by different designs in the first aspect and the second aspect. Details are not described herein again.

DESCRIPTION OF EMBODIMENTS

Figure 1:
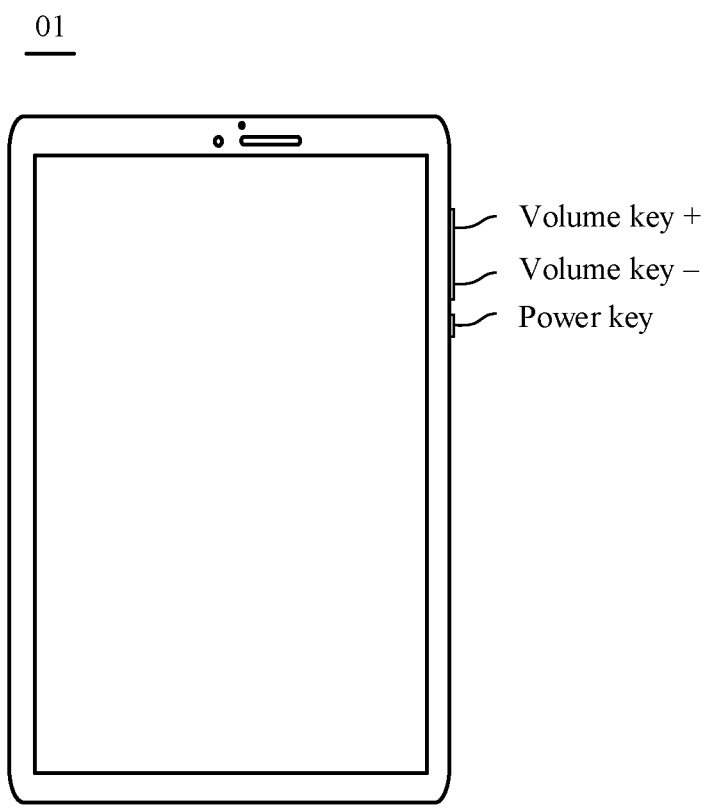
FIG. 1 is a schematic diagram of a mechanical key of an electronic device according to an embodiment of this application.

The following describes the technical solutions in the embodiments of this application with reference to the accompanying drawings in the embodiments of this application. It is clear that the described embodiments are merely a part rather than all of the embodiments of this application.

In the descriptions of this application, "/" represents an "or" relationship between associated objects unless otherwise specified. For example, A/B may represent A or B. The term "and/or" in this application indicates only an association relationship for describing associated objects and indicates that three relationships may exist. For example, A and/or B may indicate the following three cases: only A exists, both A and B exist, and only B exists, where A and B may be singular or plural. In addition, in the descriptions of this application, "a plurality of" means two or more than two unless otherwise specified. "At least one of the following items (pieces)" or a similar expression thereof means any combination of these items, including any combination of singular items (pieces) or plural items (pieces). For example, at least one of a, b, or c may indicate: a, b, c, a and b, a and c, b and c, or a, b, and c, where a, b, and c may be singular or plural. In addition, for convenience of clear description of the technical solutions in the embodiments of this application, in the embodiments of this application, terms such as "first" and "second" are used to distinguish between same objects or similar objects whose functions and purposes are basically the same. A person skilled in the art may understand that the terms such as "first" and "second" do not limit a quantity and an execution sequence, and the terms such as "first" and "second" do not indicate a definite difference. Therefore, a feature limited by "first", "second", or the like may explicitly or implicitly include one or more features. In the descriptions of this application, unless otherwise stated, "a plurality of" means two or more than two.

In addition, in this application, orientation terms such as "upper", "lower", "left", and "right" are defined relative to orientations of the components in the accompanying drawings. It should be understood that these orientation terms are relative concepts and are used for relative description and clarification, and may change correspondingly according to a change in a position in which a component is placed in the accompanying drawings.

In this application, unless otherwise explicitly specified and limited, the term "connection" should be understood in a broad sense. For example, the "connection" may be a fixed connection, a detachable connection, or an integral connection, and may be a direct connection or an indirect connection using an intermediate medium. In addition, the term "coupling" may be an electrical connection manner for implementing signal transmission. The "coupling" may be a direct electrical connection or an indirect electrical connection using an intermediate medium.

With development of electronic technologies, human-machine interaction has been widely used, and has become an indispensable information interaction medium in people's daily life. A common human-machine interaction project technology on an existing electronic device includes a mechanical key, a touch-sensitive touchscreen, a fingerprint-sensitive touchscreen, and a pressure-sensitive touchscreen. The mechanical key is used as an interaction input by determining a key pressing action. The touch-sensitive touchscreen detects touch sensing, and the touch-sensitive touchscreen includes a capacitive touchscreen, a resistive touchscreen, an ultrasonic touchscreen, and the like. A common fingerprint touch-sensitive touchscreen includes a capacitive fingerprint screen, an optical fingerprint screen, and the like. A common pressure-sensitive touchscreen mainly uses a piezoelectric pressure-sensitive element. In other words, the pressure-sensitive touchscreen is made of a piezoelectric material. Based on a principle that resistance of the piezoelectric material changes when pressure is applied to the piezoelectric material, the resistance of the piezoelectric material is detected, or a voltage on the piezoelectric material is detected under a constant current, to detect magnitude of pressure applied to the pressure-sensitive touchscreen.

Figure 2:
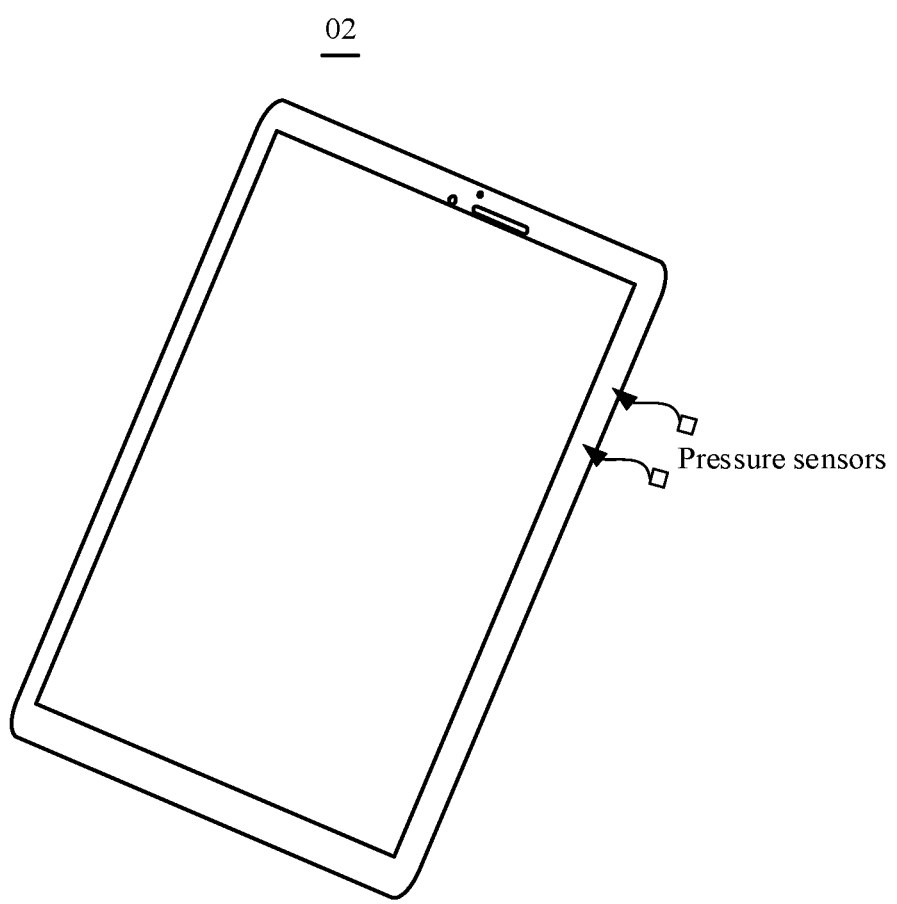
FIG. 2 is a schematic diagram of a pressure sensor of an electronic device according to an embodiment of this application.

Generally, pressing is detected on a mobile electronic consumer product (for example, a mobile phone or a smart watch) by using a mechanical key or a separate pressure sensor. A used pressure sensing technology is an external solution. A separate pressure sensor module is placed in an electronic device, to implement interaction when a user presses or touches the electronic device. For a manner of using a mechanical key, FIG. 1 is a schematic diagram of a mechanical key used on an existing electronic device 01, and the mechanical key usually includes a power key, a volume key +, and a volume key –. When the mechanical key is pressed, a level on an output terminal changes. A change of the level on the terminal is detected to determine whether the key is pressed, and a corresponding action is performed. For a manner of using a pressure sensor, FIG. 2 is a schematic diagram of a pressure sensor used on an existing electronic device 02. External pressure sensors are used on the electronic device. The pressure sensors are independently made pressure sensor modules, and are fastened under a screen and above a middle frame by using a specific bonding technology. Then, a signal terminal is led out by using a flexible printed circuit (FPC) to drive and receive signals.

However, when being used for a long time, the mechanical key used on the electronic device may be mechanically worn, and even have a potential failure risk. In addition, the mechanical key needs to occupy specific space, and needs to protrude from the device. This is not conducive to implementing integrated design of the device. Especially when the device is in a form of a mobile terminal having a waterfall screen, the mechanical key is inevitably canceled. Although a solution of installing the separate external pressure sensor can be used to resolve the foregoing problems, because the external pressure sensor needs to be fastened to the middle frame by using a glue material in extremely limited space, the external pressure sensor may fall off during a drop, resulting in a high reliability risk. In addition, a difference in assembly results in poor consistency between different devices and additional costs. To resolve the foregoing technical problems, the embodiments of this application provide the following solutions. Example descriptions are as follows.

Figure 3:
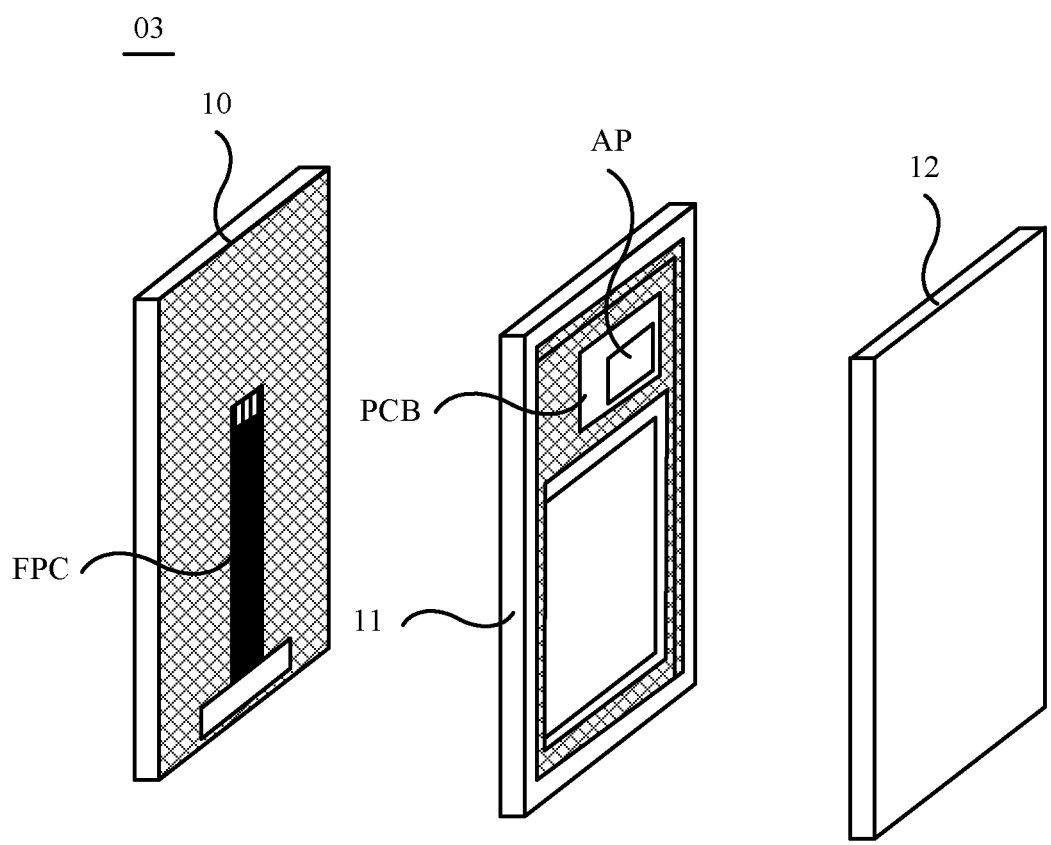
FIG. 3 is a schematic structural diagram of an electronic device according to an embodiment of this application.

An embodiment of this application provides an electronic device 03 shown in FIG. 3. The electronic device 03 includes, for example, a watch, a mobile phone, a tablet computer, a personal digital assistant (PDA), a vehicle-mounted computer, a display (monitor), and a television (TV). A specific form of the electronic device 03 is not particularly limited in this embodiment of this application. For ease of description, an example in which the electronic device 03 is a mobile phone is used for description below. As shown in FIG. 3, the electronic device 03 mainly includes a display module 10, a middle frame 11, and a housing 12. The display module 10 and the middle frame 11 are disposed in the housing 12.

Figure 4:
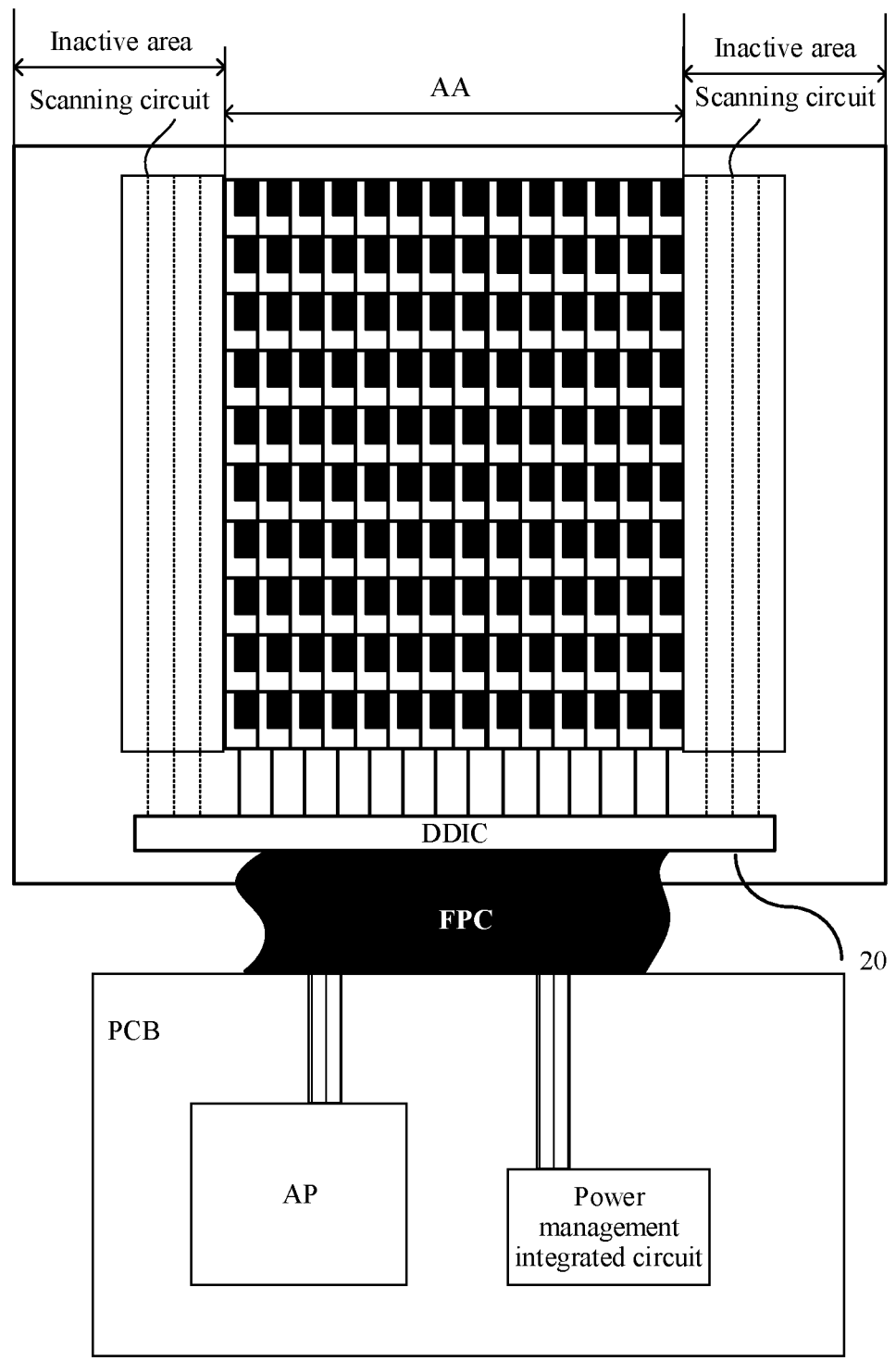
FIG. 4 is a schematic structural diagram of a display module of an electronic device according to an embodiment of this application.

As shown in FIG. 4, the display module 10 includes an active area (AA) and an inactive area located around the AA area. The AA area includes a plurality of pixels (sub pixel) arranged in a matrix form, and is also referred to as a pixel area.

In this embodiment of this application, the display module 10 is a liquid-crystal display (LCD), an organic light-emitting diode (OLED), an active-matrix organic LED or active-matrix organic LED (AMOLED), a flexible LED (FLED), a mini-LED, a micro-LED, a micro-OLED, quantum dot LED (QLED), or the like.

In addition, as shown in FIG. 4, a display driver integrated circuit (DDIC) 20 is disposed in the inactive area of the display module 10. In this case, an OLED display is used as an example. Pixel circuits in a same column of pixels are coupled to the DDIC through a same data line (data line, DL).

As shown in FIG. 4, the electronic device 03 further includes a printed circuit board (PCB) (or a drive system board), and an application processor (AP) (for example, a central processing unit (CPU)) and a power management integrated circuit (power IC) that are disposed on the PCB. The DDIC 20 in FIG. 4 is coupled to the AP through an FPC.

In this way, the AP provides display data for the DDIC and the display module, to display actual image information. The power IC provides a working voltage for the DDIC and the display module. The FPC provides a signal transmission connection path between the PCB and the display module. The FPC is connected to the PCB through a connector, and another end of the FPC is bonded (bonding) to the display module through an anisotropic conductive film. The DDIC receives a signal transmitted by the PCB and sends the signal to the display module based on specific timing control. For example, after passing through the DDIC 20, the display data output by the AP is converted into a data voltage Vdata, and the data voltage is transmitted to a pixel circuit, of a pixel, that is coupled to each DL. Next, each pixel circuit generates, by using the data voltage Vdata on the DL, a drive current I that matches the data voltage Vdata, to drive an OLED component in the pixel to emit light.

The pixel circuit, the OLED component, the DL, and the like in each pixel in the display module 03 may be made on a substrate. The substrate may be made of a flexible resin material. In this case, the OLED display may be used as a foldable display. Alternatively, the substrate in the OLED display may be made of a comparatively hard material, for example, glass. In this case, the OLED display is a hard display.

Figure 5:
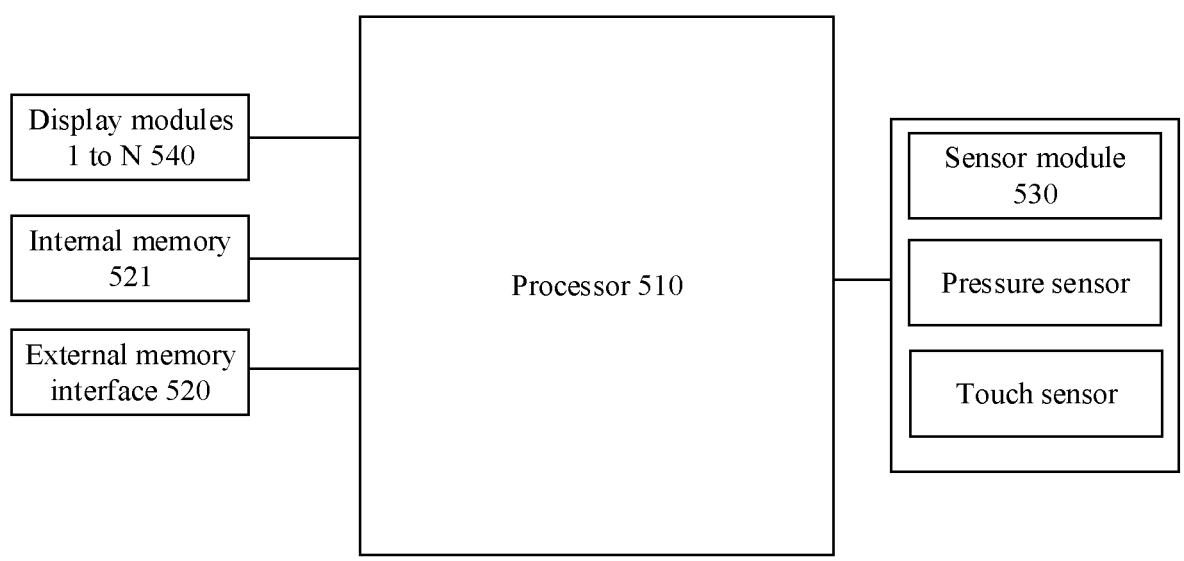
FIG. 5 is a schematic diagram of a hardware structure of an electronic device according to an embodiment of this application.

In addition, as shown in FIG. 5, an example in which a mobile phone is used as an electronic device in this application is used for description. The mobile phone may further include another component. In an example, the mobile phone is merely an example. In some examples, the mobile phone may alternatively include more or fewer functional components.

As shown in FIG. 5, a mobile phone 05 may include a processor 510, an external memory interface 520, an internal memory 521, a sensor module 530, a display module 540, and the like. The sensor module 530 may include a pressure sensor and the like provided in this application.

It may be understood that a structure shown in this embodiment of the present disclosure does not constitute a specific limitation on the mobile phone 05. In some other embodiments of this application, the mobile phone 05 may include more or fewer components than those shown in the figure, or some components may be combined, or some components may be split, or there may be a different component layout. The components shown in the figure may be implemented by hardware, software, or a combination of software and hardware.

The processor 510 may include one or more processing units. For example, the processor 510 may include an AP, a modem processor, a graphics processing unit (GPU), an image signal processor (ISP), a flight controller, a video codec, a digital signal processor (DSP), a baseband processor, and/or a neural-network processing unit (NPU), the pressure controller provided in this application, and the like. Different processing units may be independent components, or may be integrated into one or more processors.

A memory may be further disposed in the processor 510, and is configured to store instructions and data. In some embodiments, the memory in the processor 510 is a cache.

The external memory interface 520 may be configured to connect to an external storage card such as a micro SD card, to extend a storage capability of the mobile phone 05. The external storage card communicates with the processor 510 through the external memory interface 520, to implement a data storage function. For example, files such as music and a video are stored in the external storage card.

The internal memory 521 may be configured to store computer-executable program code. The executable program code includes instructions. The internal memory 521 may include a program storage area and a data storage area. The program storage area may store an operating system, an application program required by at least one function (for example, a voice playing function or an image playing function), and the like. The data storage area may store data (for example, audio data or a phone book) created during use of the mobile phone 05, and the like. In addition, the internal memory 521 may include a high-speed random-access memory, and may further include a nonvolatile memory, for example, at least one magnetic disk storage device, a flash memory device, or a universal flash storage (UFS). The processor 510 runs the instructions stored in the internal memory 521 and/or the instructions stored in the memory disposed in the processor, to execute various function applications of the mobile phone 05 and data processing.

In some embodiments, the processor 510 may include one or more interfaces. The interface may include an Inter-Integrated Circuit (I2C) interface, an I2C sound interface, a pulse code modulation (PCM) interface, a universal asynchronous receiver/transmitter (UART) interface, a mobile industry processor interface (MIPI), a general-purpose input/output (GPIO) interface, a subscriber identity module (SIM) interface, a Universal Serial Bus (USB) interface, and/or the like. The processor 510 may be coupled to the pressure sensor through the I2C interface, to implement the electronic device control method provided in this application.

The mobile phone 05 implements a display function by using the GPU, the display module 540, the AP, and the like. The GPU is a microprocessor for image processing, and is connected to the display module 540 and the application processor. The GPU is configured to perform mathematical and geometric calculation, and render an image. The processor 510 may include one or more GPUs that execute program instructions to generate or change display information.

The display module 540 is configured to display an image, a video, and the like. The display module 540 may be an LCD, an OLED, an AMOLED, an FLED, a mini-LED, a micro-LED, a micro-OLED, QLED, or the like. In some embodiments, the mobile phone 05 may include one or N display modules 540, where N is a positive integer greater than 1.

The pressure sensor is configured to sense a pressure signal, and can convert the pressure signal into an electrical signal. In some embodiments, pressing performed by a user may be determined by using the pressure sensor, so that the mobile phone 05 conveniently responds to a control instruction corresponding to the operation.

The sensor module 530 may further include a touch sensor, which is also referred to as a "touch component". The touch sensor (or a touch panel) may be disposed on the display module 540, and the touch sensor and the display module 540 form a touchscreen, which is also referred to as a "touchscreen". The touch sensor is configured to detect a touch operation performed on or near the touch sensor. The touch sensor may transfer the detected touch operation to the AP, to determine a type of a touch event. The display module 540 may provide a visual output related to the touch operation. In some other embodiments, the touch sensor may alternatively be disposed on a surface of the mobile phone 05 at a location different from that of the display module 540.

Figure 6:
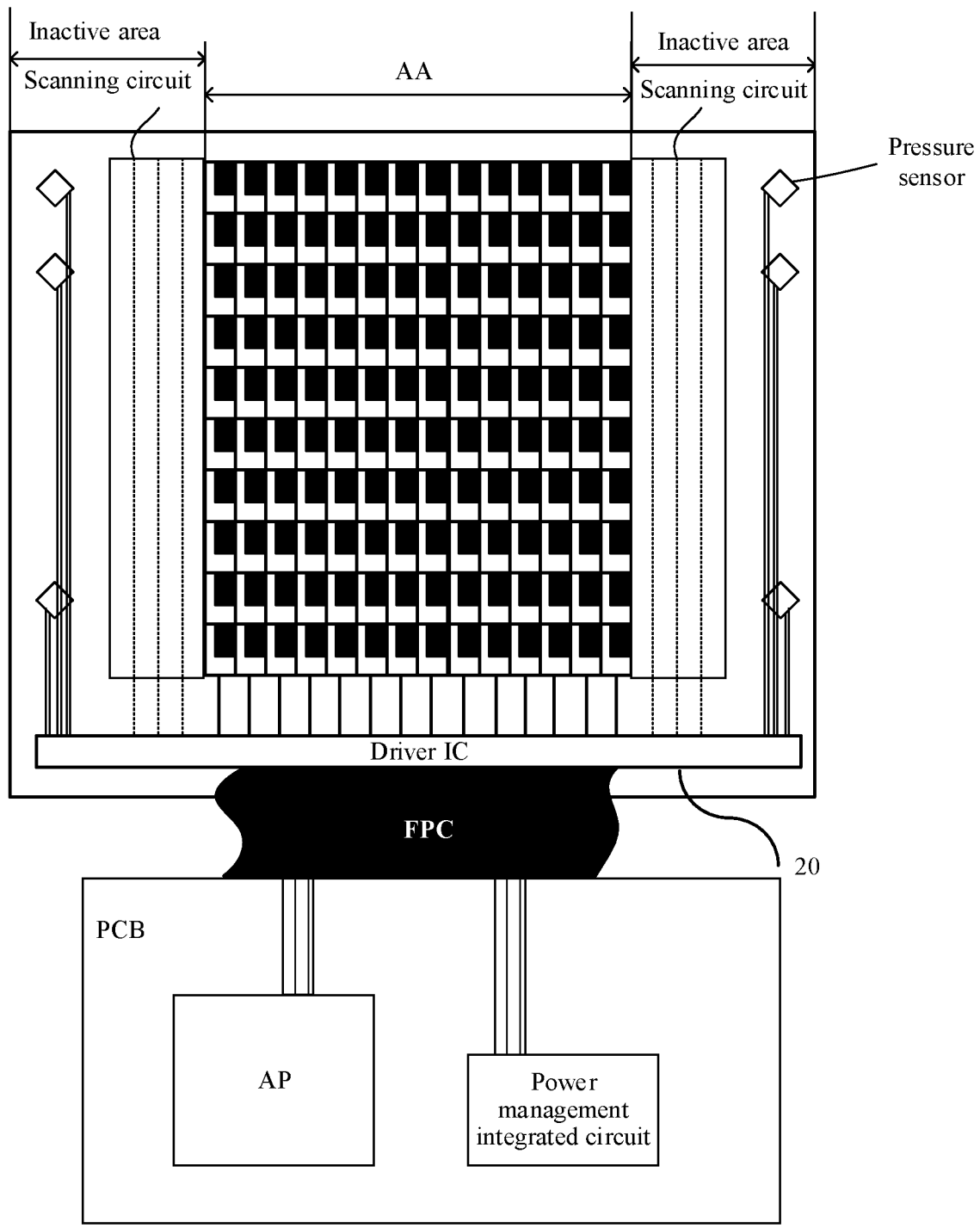
FIG. 6 is a schematic structural diagram of a display module of an electronic device according to another embodiment of this application.

The following describes a display module provided in an embodiment of this application with reference to FIG. 6. The display module in the following embodiments may be implemented in a terminal having the foregoing hardware structure or a terminal having a similar structure.

A basic principle in this embodiment of this application is that a pressure sensor is disposed in an inactive area of the display module, a pressure sensitive resistor included in the pressure sensor is disposed at a same layer as a semiconductor active layer of an active area, and the pressure sensitive resistor is made of a same material as the semiconductor active layer.

Further, referring to FIG. 6, the display module provided in this embodiment of this application includes an AA and an inactive area. The inactive area includes one or more pressure sensors, at least one pressure sensitive resistor is disposed at a same layer as the semiconductor active layer of the AA, and the at least one pressure sensitive resistor is made of a same material as the semiconductor active layer.

Figure 7:
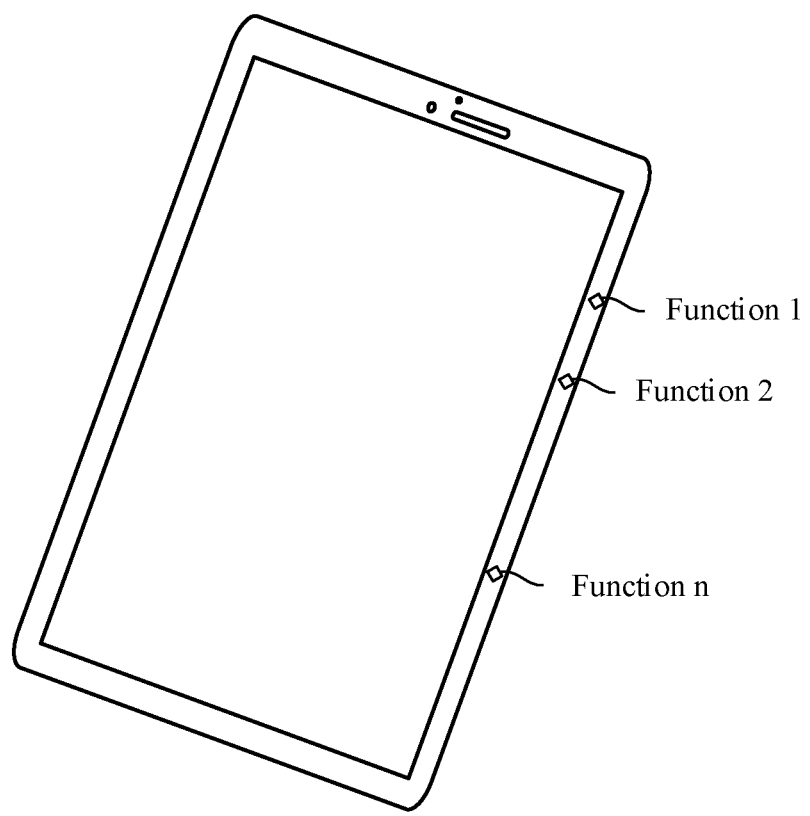
FIG. 7 is a schematic diagram of distribution of pressure sensors of an electronic device according to another embodiment of this application.

It should be noted that, as shown in FIG. 6, the active area AA is an actual imaging light emitting area of the display module, and is an area in which the display module displays an image. A data signal line in the AA provides an image signal for the AA. One end of the data signal line is connected to a pixel circuit of a pixel in AA, and the other end is connected to a driver IC by using a signal terminal. A scanning circuit in the inactive area provides the AA with a scanning signal required for image display. The scanning signal provided by the scanning circuit and the image signal provided by the data signal line serve as an input signal of the active area AA, to drive the pixel circuit in the AA to display the image. A scanning circuit signal line provides a required input signal for working of the scanning circuit to drive the scanning circuit to work. One end of the scanning circuit signal line is connected to the scanning circuit, and the other end is connected to the driving IC by using a signal terminal. The pressure sensors are disposed in the inactive area, usually on the display module. For ease of operation, the pressure sensors are generally located in frame areas on the left and right sides of a screen, or may be placed in frame areas at the top and bottom of the screen. For example, the pressure sensors are located on a side away from the AA, of the scanning circuits. The scanning circuit includes components such as a transistor and a capacitor, and these components generally need to be prepared by using a plurality of material layers. Therefore, the scanning circuit is separately disposed at some of a plurality of layers in the inactive area. A plurality of groups of pressure sensors may be distributed in a frame area of the display module. Each group of pressure sensors corresponds to a different function, and each group of pressure sensors may include one or more pressure sensors, as shown in FIG. 7, such as a pressure sensor (group) for a function 1, a pressure sensor (group) for a function 2, . . . , and a pressure sensor (group) for a function n. The pressure sensor may detect a change of external pressure and feedback the change to a processor, and the processor performs a corresponding function and provides an interaction interface. As shown in FIG. 6, the pressure sensor is connected to the driver IC by using a pressure sensor signal line. By using the pressure sensor signal line, the driver IC provides a drive signal for the pressure sensor and receives a signal output by the pressure sensor. The data signal line, the scanning circuit signal line, and the pressure sensor signal line may be connected to the driver IC by using signal terminals through specific wiring and encapsulation, to transfer the signals to the driver IC. The driver IC provides the AA, the scanning circuit, and the pressure sensors of the display module with signals required for working and receives feedback signals of the AA, the scanning circuit, and the pressure sensors. For the AA, the scanning circuit, and the pressure sensors, the driver IC may be a plurality of separate driver ICs, or may alternatively be an integrated IC. A separate driver IC is used as an example. The driver IC may include a DDIC, a scanning circuit driver IC, and a pressure controller. The pixel circuit in the active area AA is coupled to the DDIC through a data signal line. The scanning circuit is coupled to the scanning circuit driver IC through a scanning circuit signal line. The pressure sensor is coupled to the pressure controller through a pressure sensor signal line.

Figure 8:
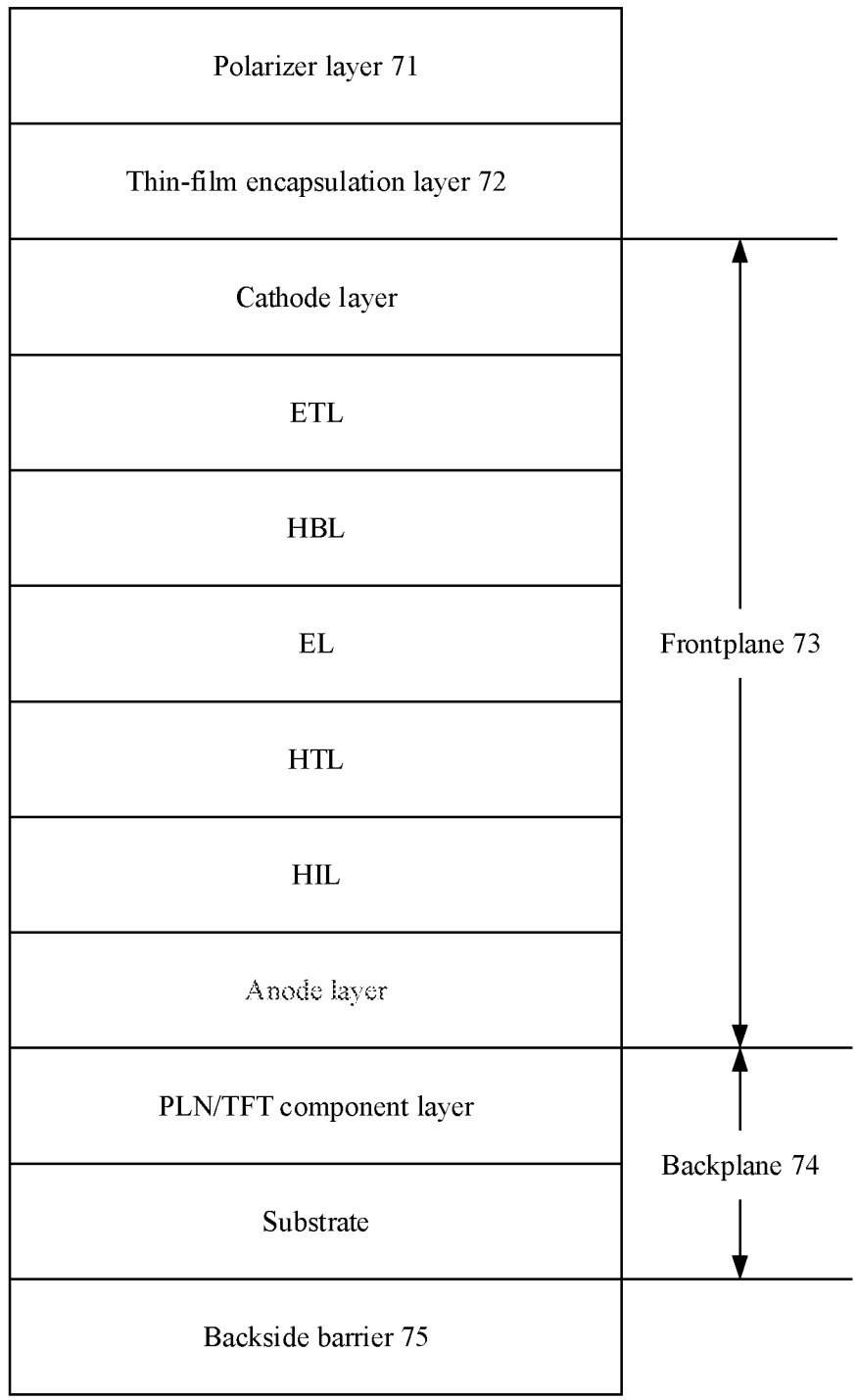
FIG. 8 is a schematic diagram of a layered structure of a display module according to an embodiment of this application.

In addition, in some examples, as shown in FIG. 8, a layered structure of the display module includes, from top to bottom, a polarizer (polarizer) layer 71, a thin-film encapsulation (TFE) layer 72, a frontplane 73, a backplane 74, and a backside barrier 75. The polarizer layer 71 includes a reflective film-side adhesive layer, a polarizer (polarizer, POL), a release film-side adhesive layer, and the like. The thin-film encapsulation layer 72 includes, from top to bottom, a silicon nitride (SiNx) layer or a silicon oxide (SiOx) layer, an organic/resin organic/resin layer, and a SiNx layer or a SiOx layer. The frontplane 73 includes, from top to bottom, a cathode layer, an electron transport layer (ETL), a hole block layer (HBL), an emission layer (EL), a hole transport layer (HTL), a hole injection layer (HIL), and an anode layer. The backplane 74 includes, from top to bottom, a planarization (PLN) layer/thin-film transistor (TFT) component layer and a substrate. The backside barrier 75 includes, from top to bottom, a SiNx layer or a SiOx layer, an organic/resin organic/resin layer, and a SiNx layer or a SiOx layer. The foregoing merely uses the OLED screen as an example for description. When an LCD screen is used, a TFT component is usually disposed in an array substrate. Details are not described herein again. The TFT component layer includes a semiconductor active layer, a plurality of conducting wire layers, and a plurality of insulation layers.

Figure 9:
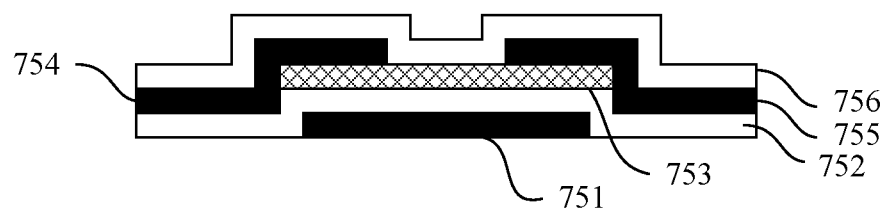
FIG. 9 is a schematic structural diagram of a TFT component layer according to an embodiment of this application.

As shown in FIG. 9, a typical structure of a TFT component layer 75 is provided. The TFT component layer 75 includes a gate 751 made of a conducting layer located at a lowermost layer, a gate insulation layer 752 covering the gate 751, a semiconductor active layer 753 covering a location corresponding to the gate 751 on the gate insulation layer 752, and a source 754 and a drain 755 that are formed on the semiconductor active layer 753. A channel is formed between the source 754 and the drain 755, and the source 754 and the drain 755 are made of a conducting layer at a same layer. A passivation insulation layer 756 covers the source 754 and the drain 755, and a pixel electrode layer 76 and another film layer 77 are made on the passivation insulation layer 756. A material of the foregoing conducting layer may be a metal material, for example, copper or another conducting material, for example, graphene. The pixel electrode layer 76 may be made of a transparent conducting material such as indium tin oxide (ITO. The semiconductor active layer may be made of a material such as silicon Si, a metal oxide, or the like. A predetermined material layer in this application includes the semiconductor active layer, and a pressure sensor includes at least one pressure sensitive resistor 78 that is at a same layer as the semiconductor active layer. FIG. 8 is an example of a layered structure of a bottom-gate TFT. It may be understood that there is another type of TFT, such as a top-gate TFT or a dual-gate TFT. When another type of TFT is used, because the TFT includes the semiconductor active layer, the pressure sensitive resistor in the pressure sensor provided in this application may be prepared at the same layer as the semiconductor active layer. Because the semiconductor active layer has a pressure-sensitive feature, namely, a feature of changing resistance after being pressed, all pressure sensitive resistors of the pressure sensor are located at the semiconductor active layer of the display module. In this way, the pressure sensitive resistors of the pressure sensor and a plurality of pressure sensitive resistors in the active area may be made at the same time each material layer of the display module is made, and at least one of the pressure sensitive resistors is made of the same material and at the same layer as the semiconductor active layer of the active area, to save space. The pressure sensor is synchronously formed in a manufacturing process of the display module without being fastened by using a glue material, so that integrity and reliability of a product can be improved.

According to a circuit design requirement of the pressure sensor, the pressure sensor may further include another resistor other than the pressure sensitive resistor. It may be understood that when the pressure sensor has the at least one pressure sensitive resistor, a function of the pressure sensor can be implemented. The other resistor is at a same layer as another material layer other than the semiconductor active layer in the display module, such as the conducting wire layer, the pixel electrode layer, or another function conducting layer (for example, an anode layer or a cathode layer of an OLED in an OLED screen). The conducting wire layer may be the conducting layer forming a gate, a source, a drain, a data signal line, a scanning circuit signal line, a pressure sensor signal line, and the like in the foregoing solution. FIG. 7 and FIG. 8 are used as an example, when an OLED display module and the bottom-gate TFT are used, the semiconductor active layer is located above a gate line (a signal line output by the scanning circuit) at a same layer as the gate, the semiconductor active layer is located below a data signal line at a same layer as the source and the drain, and the semiconductor active layer is located below the pixel electrode layer, for example, the cathode layer or the anode layer.

Figure 10:
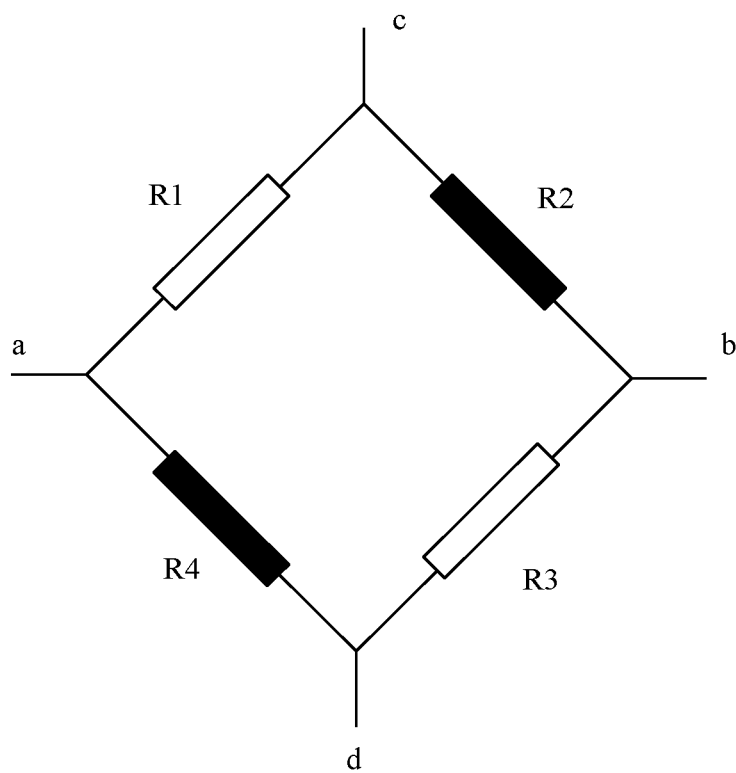
FIG. 10 is a circuit diagram of a pressure sensor according to an embodiment of this application.

Referring to FIG. 10, the pressure sensor includes four resistors R1 to R4. A first end of the first resistor R1 is coupled to a second end of the fourth resistor R4, and a second end of the first resistor R1 is coupled to a first end of the second resistor R2. A second end of the second resistor R2 is coupled to a first end of the third resistor R3, and a second end of the third resistor R3 is coupled to a first end of the fourth resistor R4. The first end of the first resistor R1, the first end of the second resistor R2, the first end of the third resistor R3, and the first end of the fourth resistor R4 are separately coupled to a pressure controller through a conducting wire. The pressure controller is configured to input a first voltage signal to the first end of the first resistor R1, input a second voltage signal to the first end of the third resistor R3, receive a third voltage signal output by the first end of the second resistor R2, receive a fourth voltage signal output by the first end of the fourth resistor R4, obtain a resistance variation of the pressure sensor based on the third voltage signal and the fourth voltage signal, and calculate, based on the resistance variation of the pressure sensor, pressure applied to the pressure sensor. The four resistors (R1\R2\R3\R4) are connected head to tail, and each resistor and two adjacent resistors separately form a node. There are totally four nodes a, b, c, and d. Two nodes a and b input signals, and two nodes c and d output signals. Two relative nodes (two non-adjacent nodes) are used as two connection terminals for the input signals, and the other group of two relative nodes are used as two connection terminals for the output signals.

The four resistors meet the following relationship: R1/R2=R4/R3, where R1 is resistance of the first resistor, R2 is resistance of the second resistor, R3 is resistance of the third resistor, and R4 is resistance of the fourth resistor.

The pressure controller inputs the first voltage signal to the first end of the first resistor R1, inputs the second voltage signal to the first end of the third resistor R3, receives the third voltage signal output by the first end of the second resistor R2, receives the fourth voltage signal output by the first end of the fourth resistor R4, and determines a resistance variation by detecting two output signals (the third voltage signal and the fourth voltage signal). A change value of a pressure sensitive resistor is related to pressure. For example, when a Si resistor receives external pressure, a change value of the resistor is proportional to the pressure, that is, $\delta R = kF$, where $\delta R$ is a resistance variation, F is the pressure, and k is a coefficient between the resistance variation and the pressure. When the pressure changes, the resistance variation is different, and the output signals of the pressure sensor change accordingly. Magnitude of the pressure can be calculated by detecting changes in the two output signals of the pressure sensor.

To increase an amplitude of the output signal of the sensor, so as to improve sensitivity of the sensor, placement locations of the pressure sensitive resistors of the pressure sensor are shown. For projections of the first resistor R1, the second resistor R2, the third resistor R3, and the fourth resistor R4 on a plane on which a surface of the display module is located, a center distance between the projection of the first resistor R1 and the projection of the third resistor R3 is less than or equal to a first distance threshold, and a center distance between the projection of the second resistor R2 and the projection of the fourth resistor R4 is less than or equal to a second distance threshold, a center distance between the projection of the first resistor R1 and the projection of the second resistor R2 is greater than or equal to a third distance threshold, or a center distance between the projection of the first resistor R1 and the projection of the fourth resistor R4 is greater than or equal to a third distance threshold, and a center distance between the projection of the third resistor R3 and the projection of the second resistor R2 is greater than or equal to a fourth distance threshold, or a center distance between the projection of the third resistor R3 and the projection of the fourth resistor R4 is greater than or equal to a fourth distance threshold. The third distance threshold is greater than the first distance threshold, the third distance threshold is greater than the second distance threshold, the fourth distance threshold is greater than the first distance threshold, and the fourth distance threshold is greater than the second distance threshold.

Figure 11:
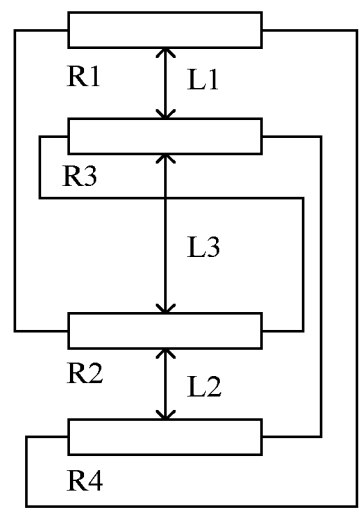
FIG. 11 is a schematic diagram of resistor wiring of a pressure sensor according to an embodiment of this application.
Figure 12:
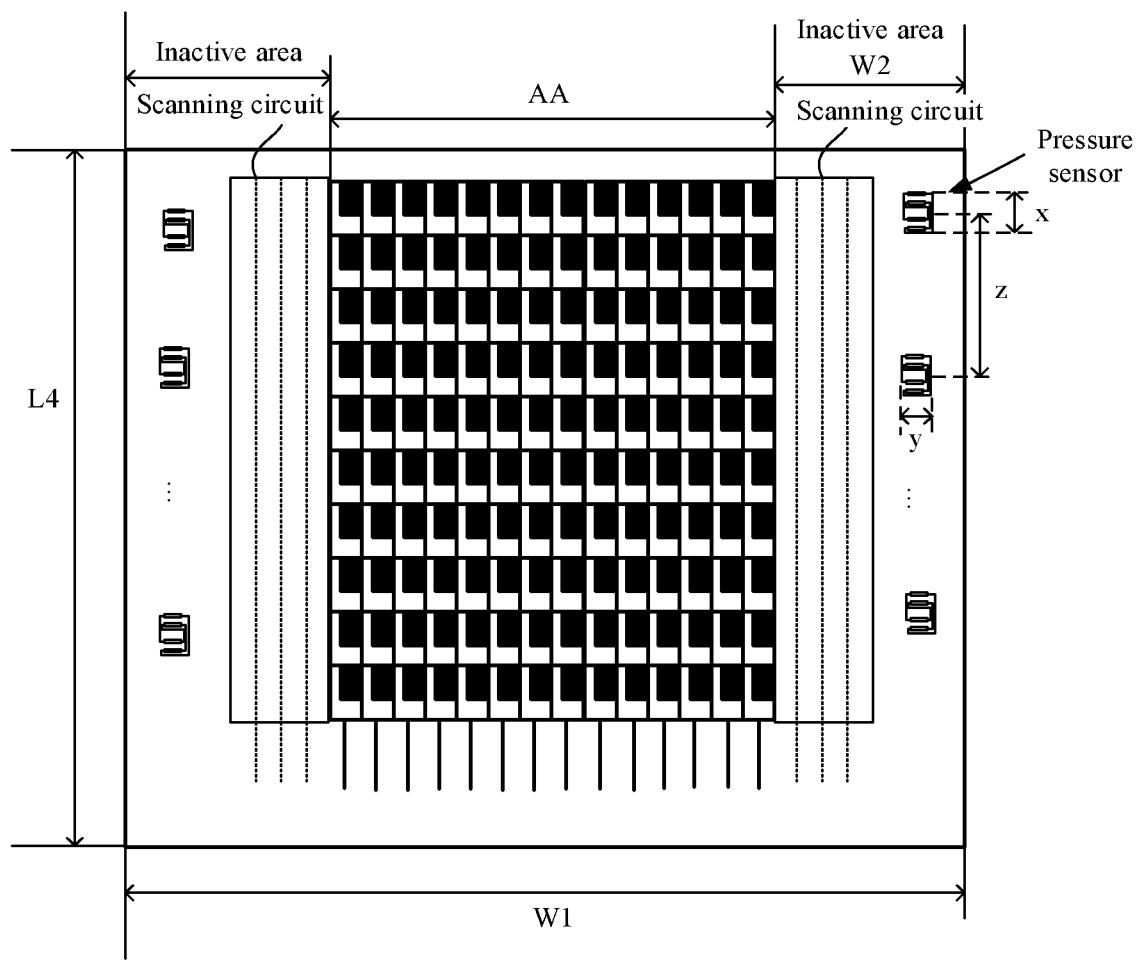
FIG. 12 is a schematic diagram of a size of a display module according to an embodiment of this application.

For example, as shown in FIG. 11, the four resistors of the pressure sensor are classified into adjacent resistors and relative resistors based on a wiring connection relationship. Two adjacent resistors are directly connected through a conducting wire formed by a conducting wire layer or a pixel electrode layer having low resistance. For example, R1 is separately adjacent to R2 and R4. There is no direct connection relationship between two relative resistors. For example, R1 and R3 are relative, and R2 and R4 are relative. Based on a relative relationship, the four resistors are divided into two groups: R1 and R3 are in one group, and R2 and R4 are in the other group. A placement relationship between the resistors inside the pressure sensor is as follows: two resistors in one group are placed close to each other, and the two groups of relative resistors are placed away from each other. For example, if a distance between the relative resistors R1 and R3 is L1, a distance between the relative resistors R2 and R4 is L2, and a distance between the two groups of relative resistor groups is L3, L1 is equal to or approximate to L2, and L3 is greater than L1 and L2. Resistance variations of the four resistors of the pressure sensor are inconsistent under an action of a same force-bearing point. In design, two resistors in one group are placed close to each other, but the two groups of relative resistors are placed away from each other, to maximize a difference in the resistance variations between the resistors and improve signal sensitivity. In addition, the display module includes at least two pressure sensors, and when the at least two pressure sensors are disposed in an inactive area on a same frame of the display module, two adjacent sensors in the at least two pressure sensors are spaced at a predetermined distance. The spacing distance may be set based on experience. For example, when a plurality of pressure sensors is required to work together, a predetermined distance at which the plurality of pressure sensors is spaced should enable that the pressure sensors can be reached simultaneously within a pressing range. Referring to FIG. 12, in an example, a size of the display module is shown. A length L4 of the display module is 150 millimeters (mm), a width W1 of the display module is 75 mm, and a width W2 of an inactive area (a right frame area as shown in the figure) is 2 mm. A plurality of pressure sensors (for example, there may be four pressure sensors) are separately distributed from top to bottom in the frame areas on the left and right sides of the display module. A spacing Z between the pressure sensors is 10 mm, a width y of the pressure sensor is 100 micrometers (um), and a length x of the pressure sensor is 400 um.

In addition, a form of the resistor in the pressure sensor is not limited in this application. Referring to FIG. 13 to FIG. 17, several typical resistor patterns are provided.

Figure 13:
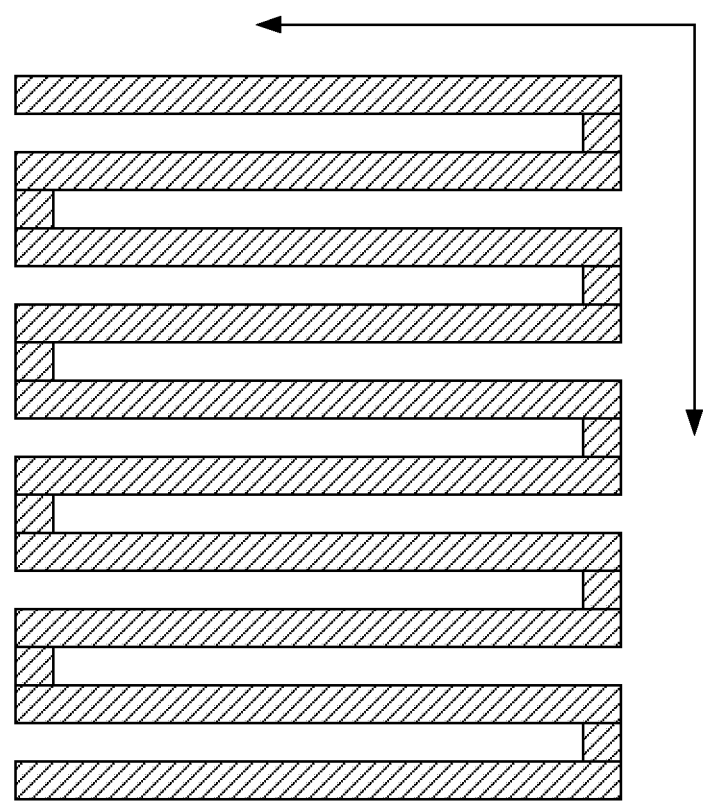
FIG. 13 is a pattern of a resistor according to an embodiment of this application.
Figure 14:
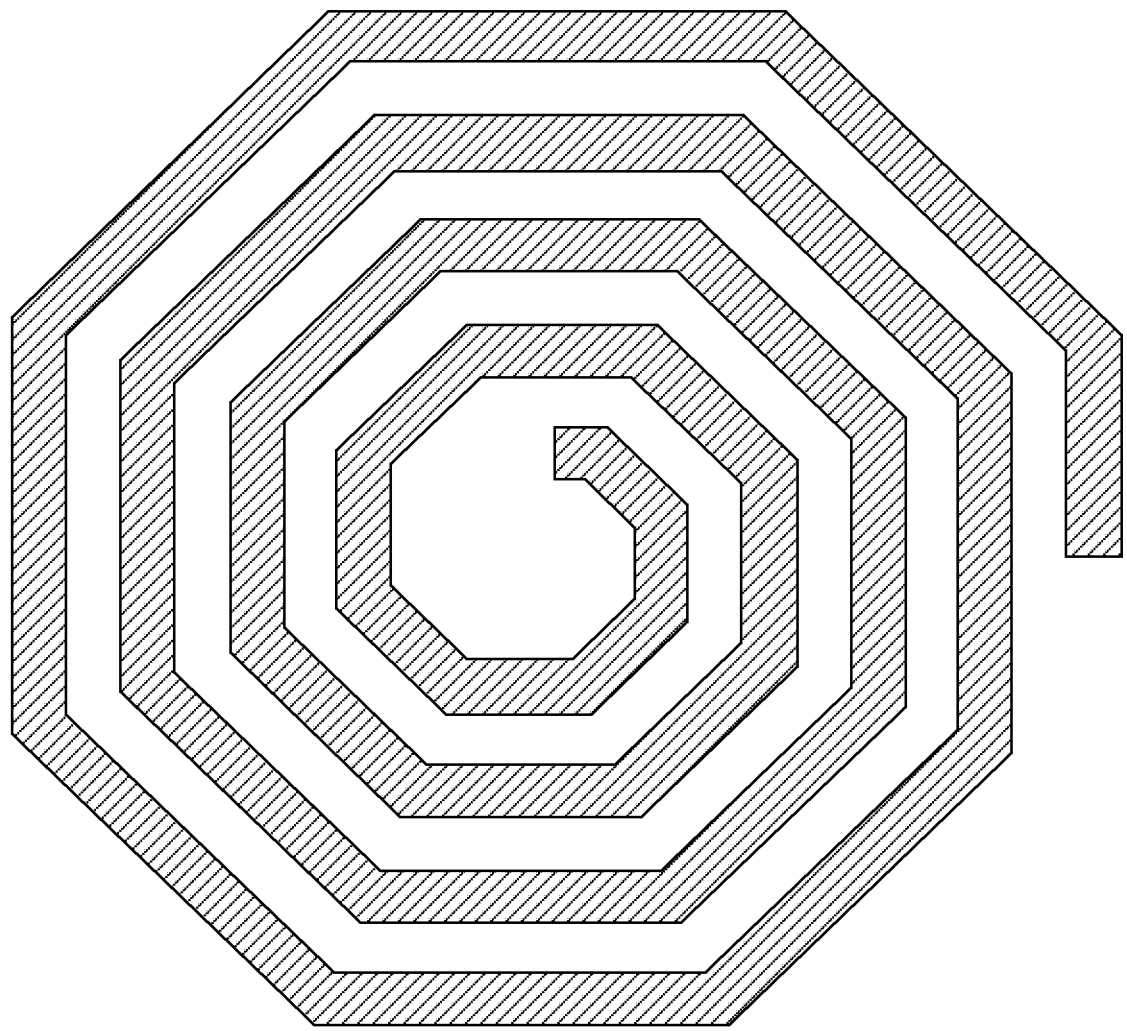
FIG. 14 is a pattern of a resistor according to another embodiment of this application.
Figure 15:
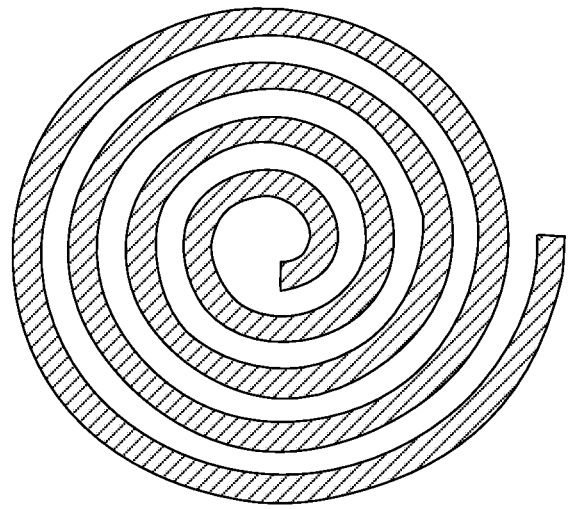
FIG. 15 is a pattern of a resistor according to another embodiment of this application.
Figure 16:
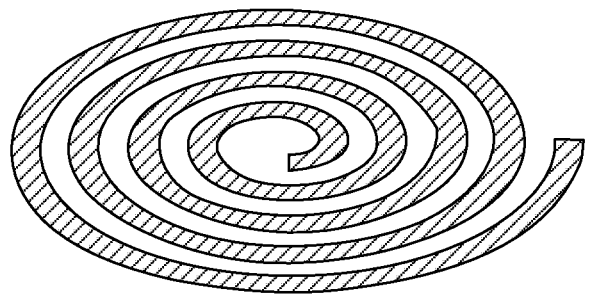
FIG. 16 is a pattern of a resistor according to another embodiment of this application.
Figure 17:
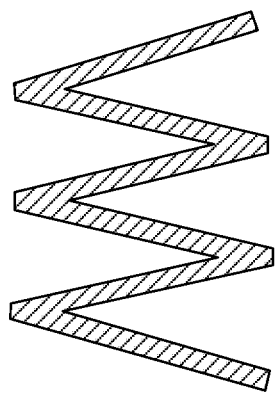
FIG. 17 is a pattern of a resistor according to another embodiment of this application.

As shown in FIG. 13, a resistance wire used for the resistor sequentially extends in orthogonal directions. A resistor pattern 1 is an orthogonal resistor pattern design. In the resistor pattern design, the resistance wire sequentially extends in the two orthogonal directions. When the pressure sensitive resistor uses this pattern, because there is a specific angular relationship between a pressing point and a pressure sensor, there is a pressure difference between output signals of the pressure sensor each time an orientation relationship between the pressing point and the pressure sensor is inconsistent. A resistance wire used for a resistor in FIG. 14 to FIG. 16 is helical. In an example, a resistor pattern 2 shown in FIG. 14 is a regular polygon or a similar (approximate) regular polygon (a regular octagon is shown in the figure, and another regular polygon or similar (approximate) regular polygon is also included). The resistor pattern is formed by sequentially connecting a plurality of coils of resistance wires from inside to outside. A length of a segment of straight resistance wire of an inner coil is less than a length of a segment of straight resistance wire of an outer coil, and an angle (60 degrees)(° to 180°) between two segments of straight resistance wires is fixed. A resistor pattern 3 shown in FIG. 15 is circular or similar (approximate) circular. The resistor pattern is formed by sequentially connecting a plurality of coils of resistance wires from inside to outside, and a radius of a segment of arc-shaped resistance wire of an inner coil is less than a radius of a segment of arc-shaped resistance wire of an outer coil. A resistor pattern 4 shown in FIG. 16 is elliptical or similar (approximate) elliptical. The resistor pattern is formed by sequentially connecting a plurality of coils of resistance wires from inside to outside. Each segment of resistance wire from an inner coil to an outer coil presents an elliptical arc, and an arc length of an elliptical arc of the inner coil is less than an elliptical arc of the outer coil. A resistor shown in FIG. 17 is formed by connecting straight conducting wire segments in series, and an included angle between adjacent straight conducting wire segments is a fixed value. In an example, a resistor pattern 5 is formed by sequentially connecting a plurality of segments of straight resistance wires at a fixed angle (an angle ranging from 0 to 90°. A common feature of the resistor pattern 2 to the resistor pattern 5 lies in that there are relatively large components along a symmetry axis (or an approximate symmetry axis) of the resistor pattern and two orthogonal directions of the resistor pattern. When the pressure sensitive resistor uses the pattern, even when an angle between a pressing point and the pressure sensor changes, a total variation of all the resistors can be ensured to be close, so that a signal deviation problem caused by the orientation relationship between the pressing point and the pressure sensor can be eliminated, unidirectional sensitivity of strain can be eliminated, and strain in all directions tends to be uniform.

Figure 18:
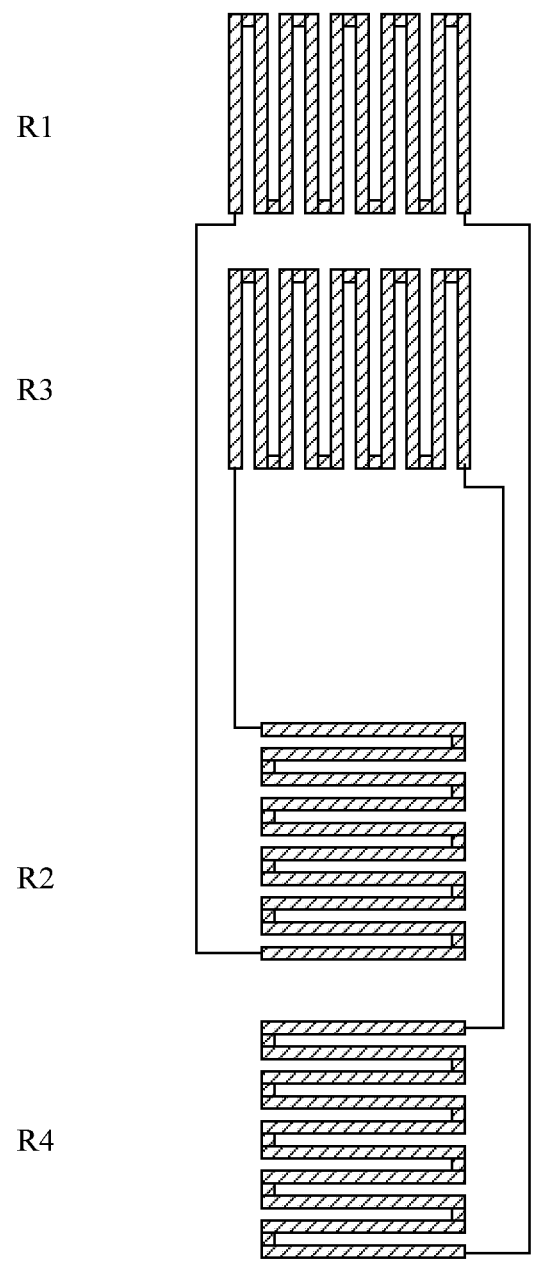
FIG. 18 is a schematic diagram of resistor wiring of a pressure sensor according to another embodiment of this application.
Figure 19:
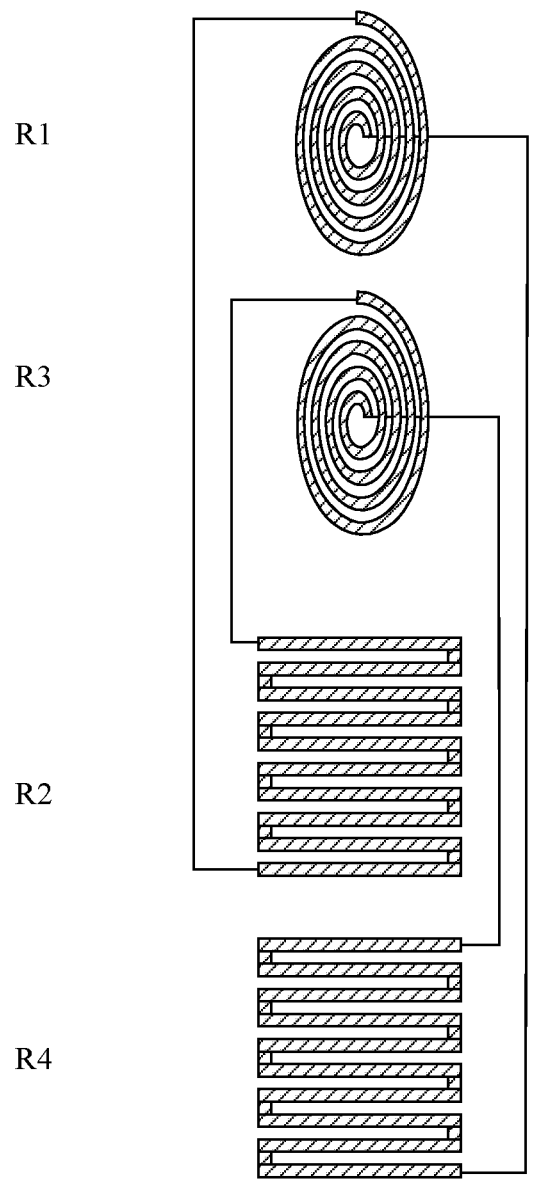
FIG. 19 is a schematic diagram of resistor wiring of a pressure sensor according to another embodiment of this application.
Figure 20:
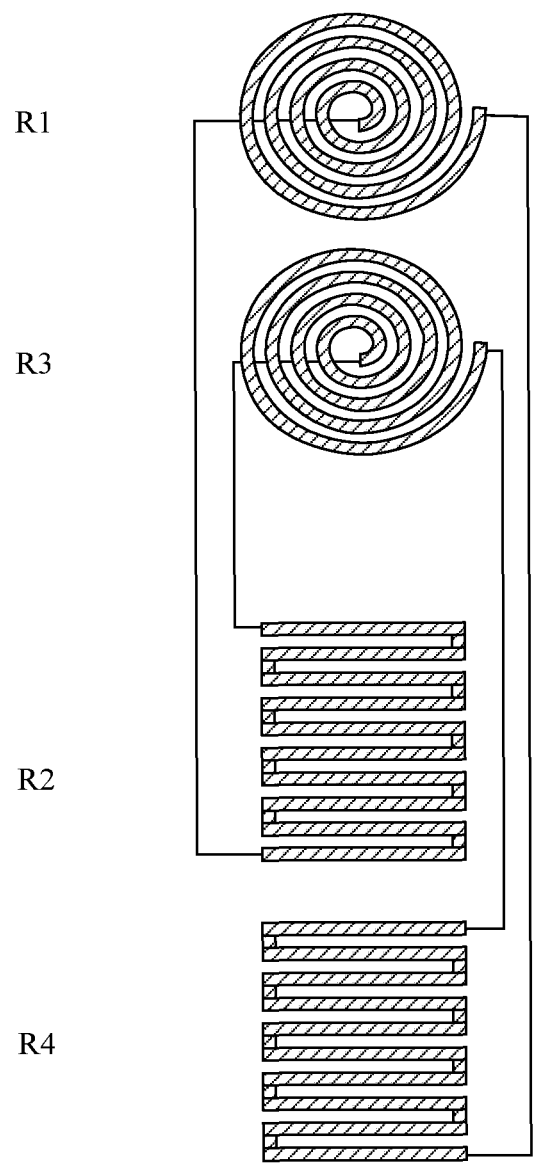
FIG. 20 is a schematic diagram of resistor wiring of a pressure sensor according to another embodiment of this application.
Figure 21:
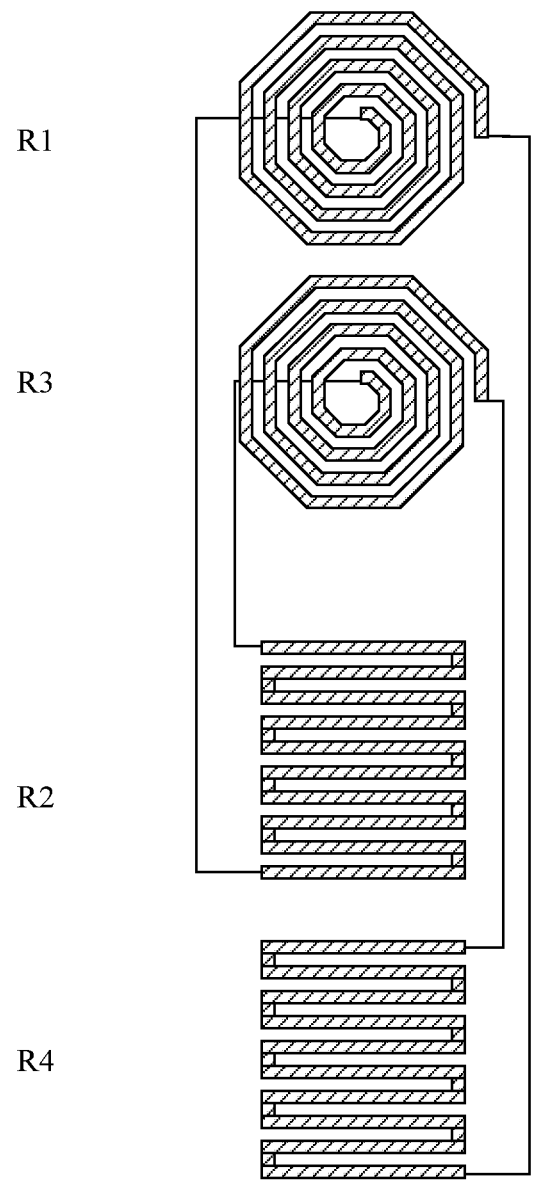
FIG. 21 is a schematic diagram of resistor wiring of a pressure sensor according to another embodiment of this application.
Figure 22:
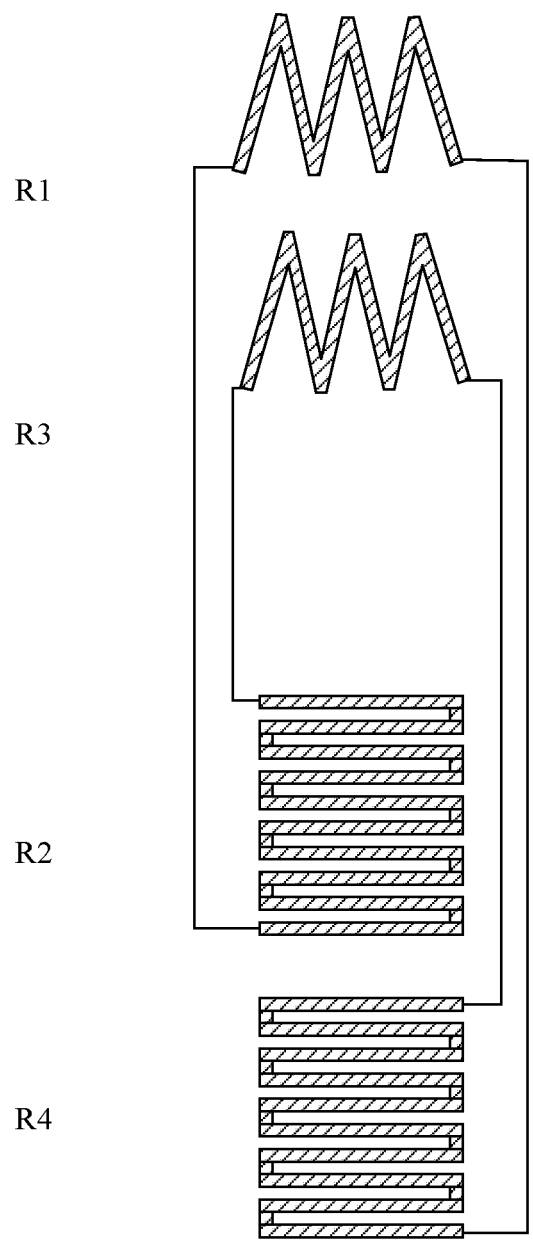
FIG. 22 is a schematic diagram of resistor wiring of a pressure sensor according to another embodiment of this application.
Figure 23:
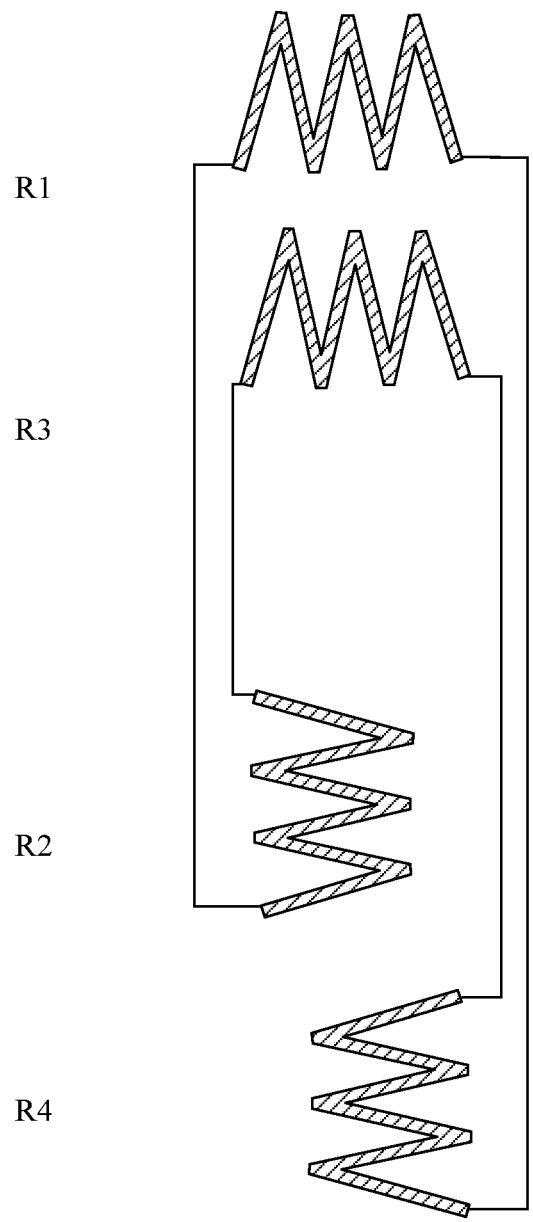
FIG. 23 is a schematic diagram of resistor wiring of a pressure sensor according to another embodiment of this application.
Figure 24:
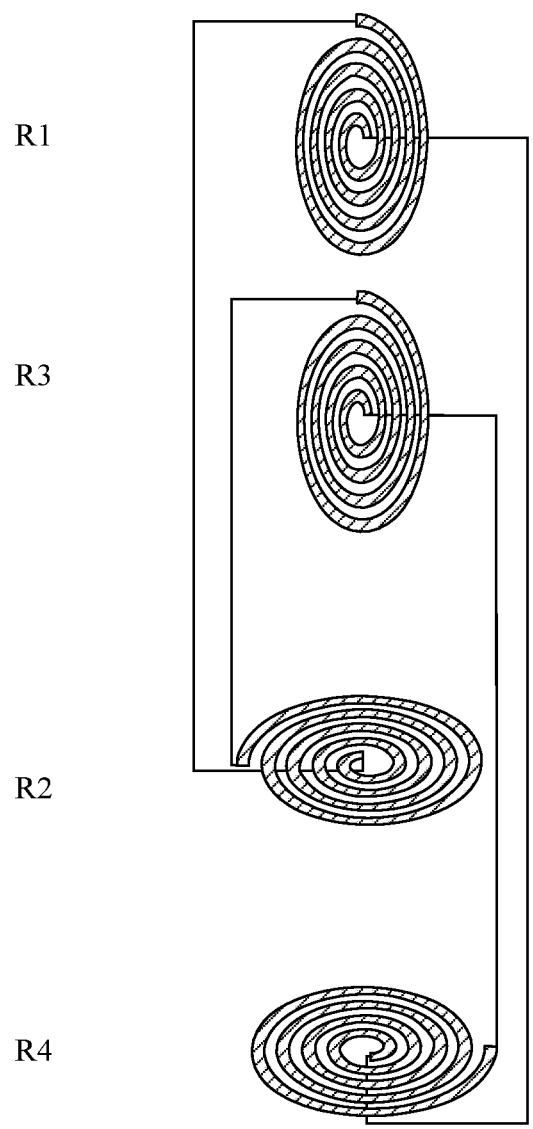
FIG. 24 is a schematic diagram of resistor wiring of a pressure sensor according to another embodiment of this application.

In addition, the first resistor, the second resistor, the third resistor, and the fourth resistor use a same pattern, or the first resistor and the third resistor use a same pattern, and the second resistor and the fourth resistor use a same pattern. As shown in FIG. 18, all R1 to R4 use the resistor pattern 1. Certainly, all R1 to R4 may use any other resistor pattern. As shown in FIG. 19 to FIGS. 24, R1 and R3 use a same resistor pattern, and R2 and R4 use a same resistor pattern. The foregoing figures are merely examples. In addition, another combination of the foregoing resistor patterns also falls within the protection scope of the present disclosure. In addition, it should be noted that for the relative resistors, for example, the resistors R1 and R3, or the resistors R2 and R4, only resistor patterns of the relative resistors are limited to be the same. It may be understood that this can ensure that a difference in resistance variations before and after pressing is maximized, to improve sensitivity of the sensor when pressing occurs. An angle difference between the relative resistors is not limited in this application. For example, a resistor pattern of R1 may be a resistor pattern obtained after a resistor pattern of R3 is rotated by a specific angle. In FIG. 24, a resistor pattern of R2 is a resistor pattern obtained after a resistor pattern of R4 is rotated by 180 degrees.

An embodiment of this application further provides an electronic device control method. An electronic device includes the foregoing display module. The control method includes the following steps.

101: Input a drive signal to a pressure sensor, and collect a sensor signal output by the pressure sensor.

102: Generate a control signal for a predetermined function based on the sensor signal.

Figure 25:
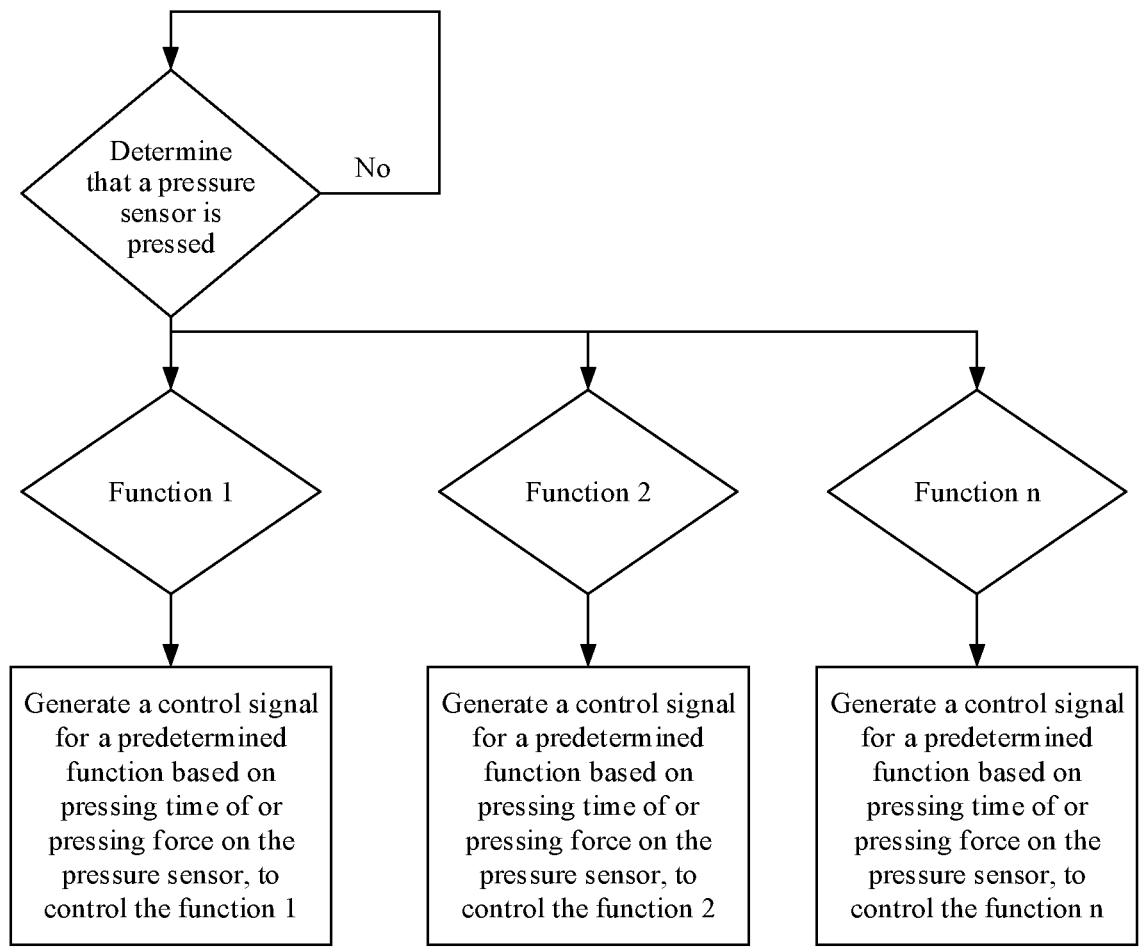
FIG. 25 is a schematic flowchart of an electronic device control method according to an embodiment of this application.

Based on the description of the foregoing embodiment, a pressure controller can input a drive signal to the pressure sensor, and receive a sensor signal output by the pressure sensor. Therefore, when the pressure sensor is pressed, it may be determined, based on a sensor signal at this time, that the pressure sensor is pressed, and then the control signal for the predetermined function is generated. For example, each pressure sensor is pre-configured to control one function, or a plurality of pressure sensors are jointly configured to control one function. When the pressure sensor is pressed, the control signal for the predetermined function may be generated based on the sensor signal generated by the pressure sensor, and the function is controlled to perform a corresponding operation. Step 102 further includes determining pressing time of or pressing force on the pressure sensor based on the sensor signal, and generating the control signal for the predetermined function based on the pressing time of or the pressing force on the pressure sensor. For example, when it is detected that pressing occurs, the pressure controller reads a sensor signal output by each pressure sensor to determine a function module corresponding to the pressure sensor, and performs a corresponding function based on pressing time or pressing force. For example, if the corresponding function module needs to be divided into a plurality of levels (for example, a volume adjustment operation or a brightness adjustment operation), correspondingly, the pressing force needs to be divided into a plurality of levels or the pressing time needs to be divided into a plurality of levels. A mapping relationship between the levels of the force or the levels of the pressing time and levels of the corresponding function is established, and a lookup table is established. In this solution, an electronic device control apparatus may generate different control signals based on different pressing time of or pressing force on the pressure sensor. This enriches a manner of controlling the electronic device. As shown in FIG. 25, when it is determined that a pressure sensor is pressed, a predetermined function corresponding to the pressed sensor is determined in n pressure sensors, and a control signal for the predetermined function is generated based on a sensor signal. For example, the control signal for the predetermined function is generated based on pressing time of or pressing force on the pressure sensor, to control the predetermined function. For example, the predetermined function includes a volume control function. A control signal for controlling volume increase or decrease is generated based on the pressing time of or the pressing force on the pressure sensor. The predetermined function includes a power key function. When it is determined that pressing time T of the pressure sensor is less than T1, it is determined that the power key function is not responding, when it is determined that the pressing time T of the pressure sensor is greater than T1 but less than T2, a sleep signal is generated, and when it is determined that the pressing time T of the pressure sensor is greater than T3, a power-off or restart signal is generated, where T1<T2<T3. The predetermined function includes a shortcut key function. An invoking signal for invoking a predetermined application is generated based on the sensor signal.

Figure 26:
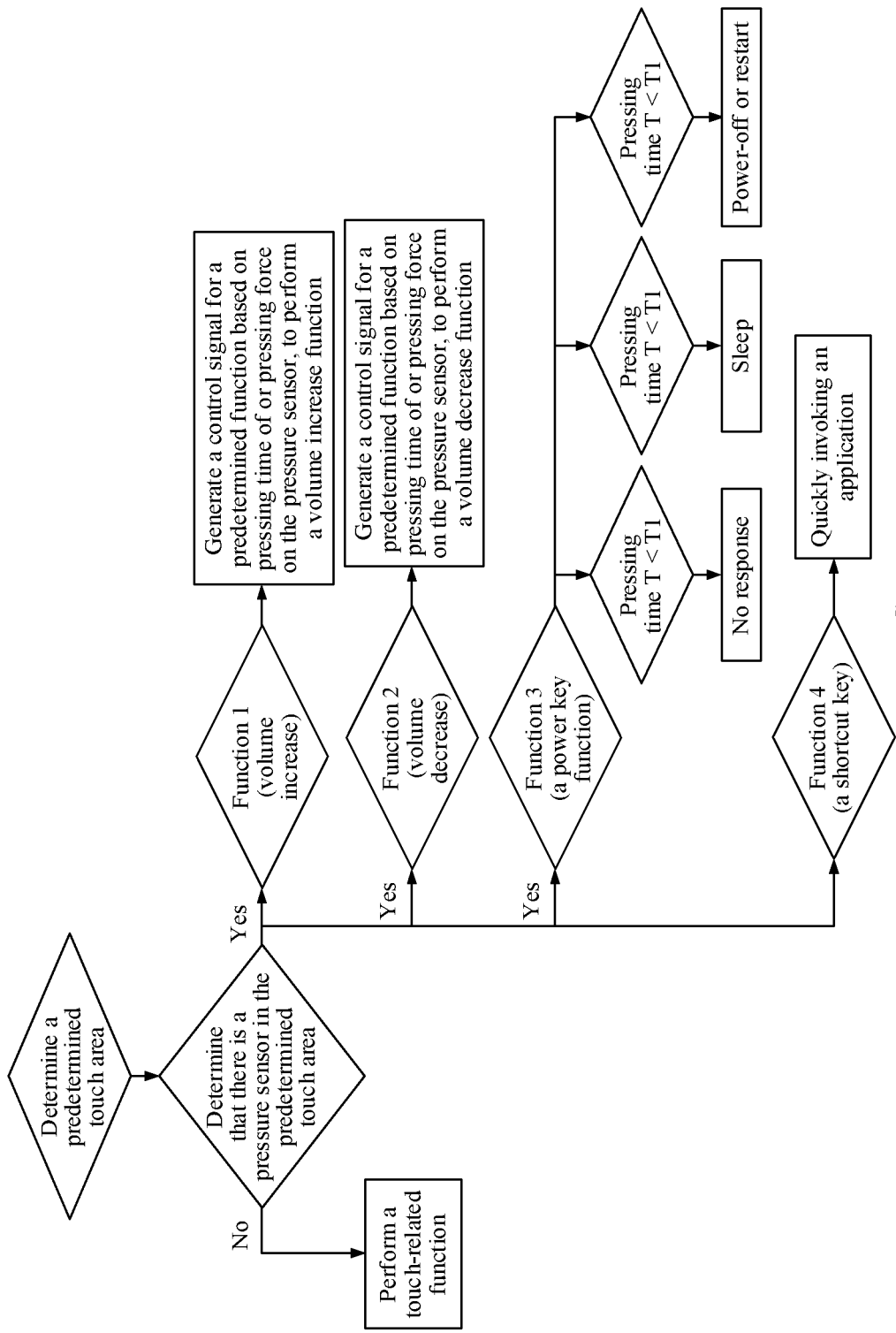
FIG. 26 is a schematic flowchart of an electronic device control method according to another embodiment of this application.

In another example, when the display module is combined with a touchscreen, a touch apparatus is disposed on the display module, or a touch function film layer is integrated into the display module. In this case, it may be determined, in a positioning manner of the touchscreen, whether a part at which pressing occurs falls in an area that has a pressure sensor and that is in an inactive area. Then, a corresponding function is performed based on the pressure sensor corresponding to the area in which the pressing occurs. In this case, the method further includes: determining a pressure sensor in a predetermined touch area, where the pressure sensor in the predetermined touch area is configured to correspond to the predetermined function. If there is no pressure sensor in the predetermined touch area, a touch-related function is performed. Referring to FIG. 26, the predetermined touch area is first determined. It is then determined that there is a pressure sensor in the predetermined touch area. When it is determined that the pressure sensor is pressed, a predetermined function corresponding to the pressed sensor is determined, and a control signal for the predetermined function is generated based on a sensor signal. For example, the control signal for the predetermined function is generated based on pressing time of or pressing force on the pressure sensor, to control the predetermined function. As shown in FIG. 26, functions of the pressure sensor include volume increase, volume decrease, a power key function, a shortcut key function (for example, a quick application (APP) invoking function), and another corresponding function. During detection and execution of the pressure sensor for the power key function, sleep, power-off, or restart may be determined based on detected pressing time. For example, when pressing time T is less than T1, it is determined that the power key function is not responding, when the pressing time T is greater than T1 but less than T2, it is determined that the power key function is sleep, and when the pressing time T is greater than T3, it is determined that the power key function is power-off or restart, where T1<T2<T3.

Figure 27:
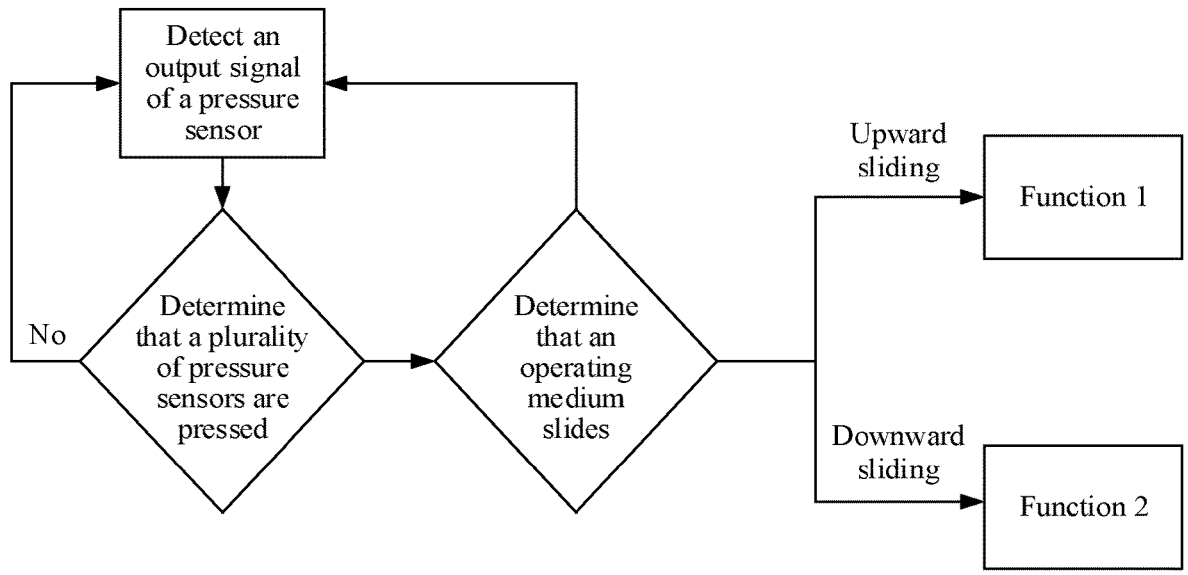
FIG. 27 is a schematic flowchart of an electronic device control method according to another embodiment of this application.
Figure 28:
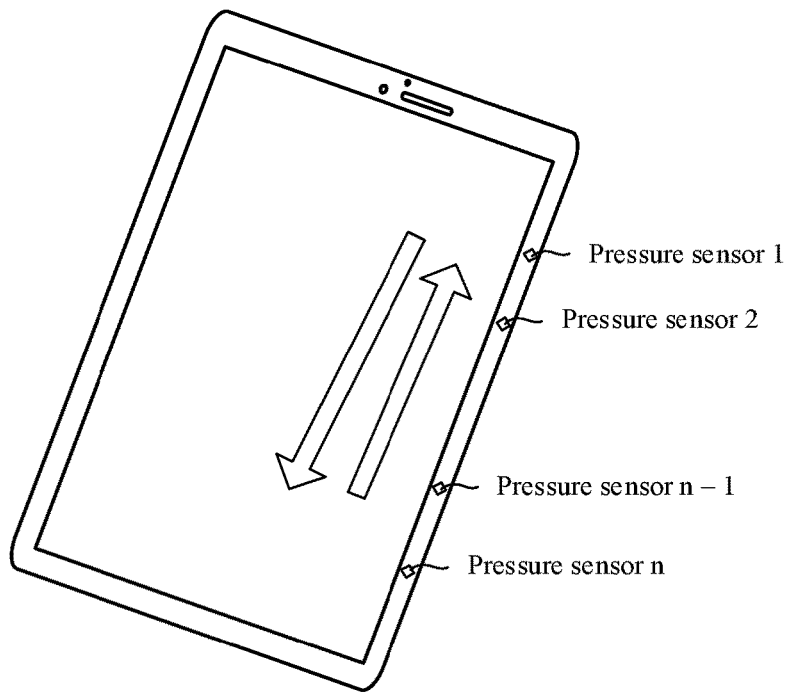
FIG. 28 is a schematic diagram of an electronic device having a plurality of pressure sensors according to an embodiment of this application.

In another example, step 102 may include generating the control signal for the predetermined function based on sensor signals generated by at least two pressure sensors. In this solution, the electronic device control apparatus may generate different control signals based on different combinations of sensor signals of a plurality of pressure sensors. This enriches a manner of controlling the electronic device. In an example, the pressure controller may detect a relationship between output signals of a plurality of groups of pressure sensors, to determine a sliding direction of an operating medium (a finger or the like). As shown in FIG. 27, when it is determined that a plurality of pressure sensors is pressed, a sliding direction of an operating medium (a finger or the like) is determined based on sensor signals generated by the pressure sensors. A corresponding function is performed based on the sliding direction. For example, whether the sliding direction is upward or downward may be determined by the pressure sensors, to determine whether to perform volume increase or decrease. Certainly, the foregoing merely provides an example of determining the sliding direction based on the output signals of the plurality of pressure sensors. It may be understood that there may be another manner of generating the control signal for the predetermined function based on the sensor signal. For example, when it is detected that two specific sensors simultaneously output sensor signals for more than predetermined duration, functions such as screenshot or power-off is generated and performed. With reference to FIG. 28, a specific manner of determining the sliding direction by detecting the output signals of the plurality of pressure sensors in this application is described below.

Figure 29:
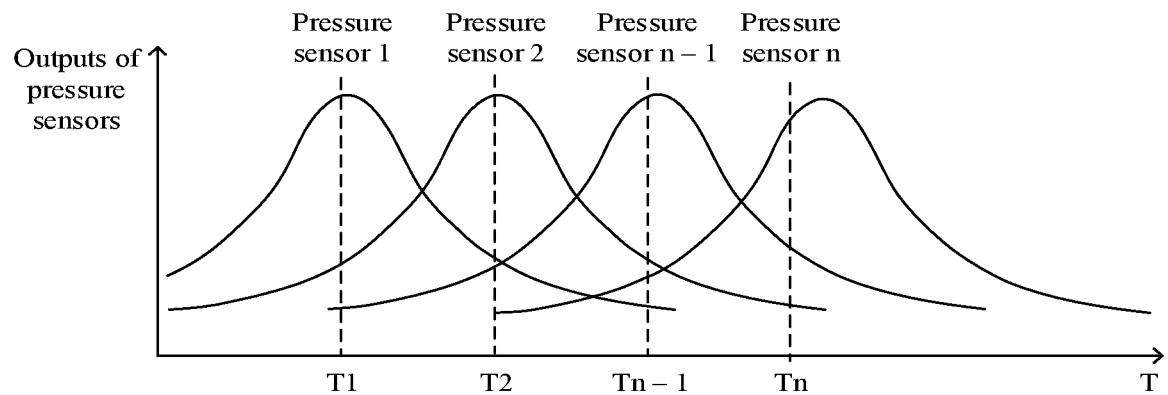
FIG. 29 is a schematic diagram of an output value of a sensor according to an embodiment of this application.
Figure 30:
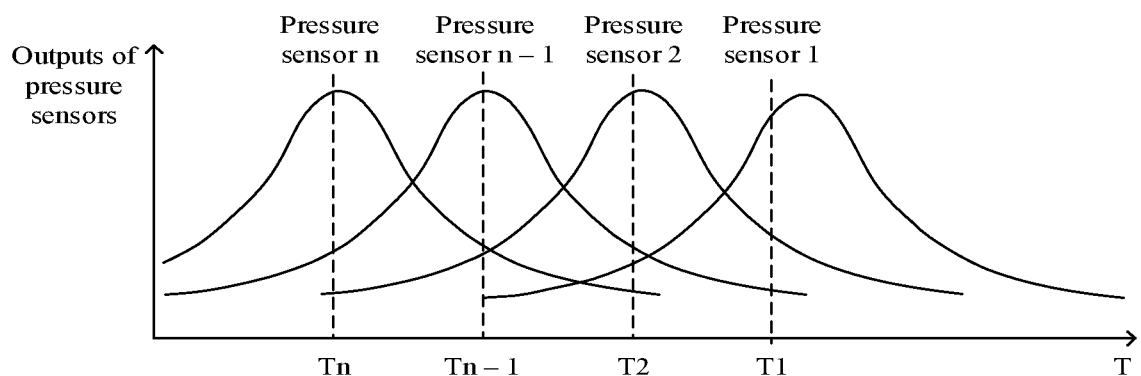
FIG. 30 is a schematic diagram of an output value of a sensor according to another embodiment of this application.

The pressure sensors are arranged in a top-down order of a pressure sensor 1, a pressure sensor 2, . . . , a pressure sensor n−1, and a pressure sensor n in a frame area of the display module. When the finger slides near the pressure sensor, a sensor output is mathematically inversely correlated with a length from the finger to the pressure sensor. When a pressing point of the finger is in the middle of the pressure sensor, an output of the pressure sensor is largest. When the pressing point of the finger is away from the pressure sensor, the output of the pressure sensor decreases. When the finger unidirectionally slides in the frame area of the display module, an output of each pressure sensor at each time point is recorded, and a sliding direction of the finger may be determined based on time of a peak of a sensor signal output by each pressure sensor and relative strength of signals between the pressure sensors. Time points T1 to Tn when peak points of the pressure sensor 1 to the pressure sensor n occur are recorded. If T1<T2< . . . <Tn, it is determined that the sliding direction is downward, as shown in FIG. 29. If T1>T2> . . . >Tn, it is determined that the sliding direction is upward, as shown in FIG. 30. In another case, based on output values of the pressure sensors at two moments (T0, T1), two pressure sensors with largest output values at the moment T0 are selected and denoted as a pressure sensor m and a pressure sensor m+1 (1≤m≤n). The output values corresponding to the two pressure sensors are denoted as S[m, T0] and S[m+1, T0]. Then, outputs S[m, T1] and S[m+1, T1] corresponding to the two pressure sensors at a next detection time point T1 are recorded. If S[m, T0]>S[m, T1] and S[m+1, T0]<S[m+1, T1], or S[m, T0]<S[m, T1], S[m+1, T0]<S[m+1, T1], and S[m, T0]>S[m+1, T0], or S[m, T0]>S[m, T1], S[m+1, T0]>S[m+1, T1], and S[m, T0]<S[m+1, T0], the sliding direction is downward. Otherwise, the sliding direction is upward. When the pressure sensors are arranged in another manner or arranged in another area, a determining manner is consistent, and a sliding trend is determined based on a relationship between arrangements of the corresponding pressure sensors.

It may be understood that, in the foregoing embodiments of the electronic device control method, methods and/or steps implemented by an electronic device control apparatus may also be implemented by a component (for example, a chip or a circuit) that may be used in the electronic device control apparatus.

It may be understood that, to implement the foregoing functions, the electronic device control apparatus includes a corresponding hardware structure and/or software module for implementing each function. A person skilled in the art should easily be aware that, in combination with units and algorithm steps of the examples described in the embodiments disclosed in this specification, this application may be implemented by hardware or a combination of hardware and computer software. Whether a function is performed by hardware or hardware driven by computer software depends on a particular application and a design constraint of the technical solutions. A person skilled in the art may use different methods to implement the described functions for each particular application, but it should not be considered that the implementation goes beyond the scope of this application.

In the embodiments of this application, the electronic device control apparatus may be divided into functional modules based on the foregoing method embodiments. For example, each functional module may be obtained through division based on each corresponding function, or two or more functions may be integrated into one processing module. The integrated module may be implemented in a form of hardware, or may be implemented in a form of a software functional module. It should be noted that, in the embodiments of this application, division into the modules is an example, and is merely logical function division. In an actual implementation, another division manner may be used.

Figure 31:
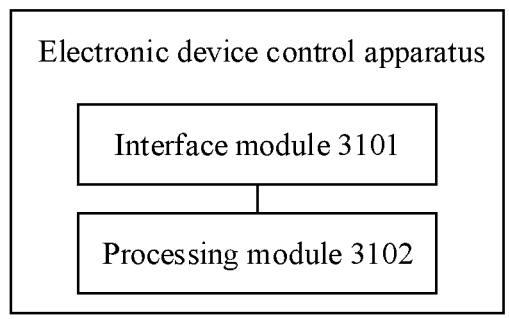
FIG. 31 is a schematic structural diagram of an electronic device control apparatus according to an embodiment of this application.

FIG. 31 is a schematic structural diagram of an electronic device control apparatus. The electronic device control apparatus includes an interface module 3101 and a processing module 3102.

All related content of the steps in the foregoing method embodiments may be cited in function descriptions of corresponding function modules.

In this embodiment, the electronic device control apparatus is presented in a form in which function modules are obtained through division in an integrated manner. The "module" herein may be an application-specific integrated circuit (ASIC), a circuit, a processor that executes one or more software or firmware programs and a memory, an integrated logic circuit, and/or another component that can provide the foregoing functions.

In an example, the interface module 3101 is configured to input a drive signal to a pressure sensor, and collect a sensor signal output by the pressure sensor. The processing module 3012 is configured to generate a control signal for a predetermined function based on the sensor signal collected by the interface module 3101.

Optionally, the processing module 3012 is configured to determine pressing time of or pressing force on the pressure sensor based on the sensor signal, and generate the control signal for the predetermined function based on the pressing time of or the pressing force on the pressure sensor.

Optically, a display module includes at least two pressure sensors. When the at least two pressure sensors are disposed in an inactive area on a same frame of the display module, two adjacent sensors in the at least two pressure sensors are spaced at a predetermined distance, and the processing module 3102 is configured to generate the control signal for the predetermined function based on sensor signals generated by the at least two pressure sensors.

Optionally, the processing module 3102 is further configured to determine a pressure sensor in a predetermined touch area, where the pressure sensor in the predetermined touch area is configured to correspond to the predetermined function.

Optionally, the predetermined function includes a volume control function. The processing module 3102 is configured to generate, based on the pressing time of or the pressing force on the pressure sensor, a control signal for controlling volume increase or decrease.

Optionally, the predetermined function includes a power key function. The processing module 3102 is configured to, when it is determined that pressing time T of the pressure sensor is less than T1, determine that the power key function is not responding, when it is determined that the pressing time T of the pressure sensor is greater than T1 but less than T2, generate a sleep signal, and when it is determined that the pressing time T of the pressure sensor is greater than T3, generate a power-off or restart signal, where T1<T2<T3.

Optionally, the predetermined function includes a shortcut key function. The processing module 3102 is configured to generate, based on the sensor signal, an invoking signal for invoking a predetermined application.

All related content of the steps in the foregoing method embodiments may be cited in function descriptions of corresponding function modules. Details are not described herein again.

Figure 32:
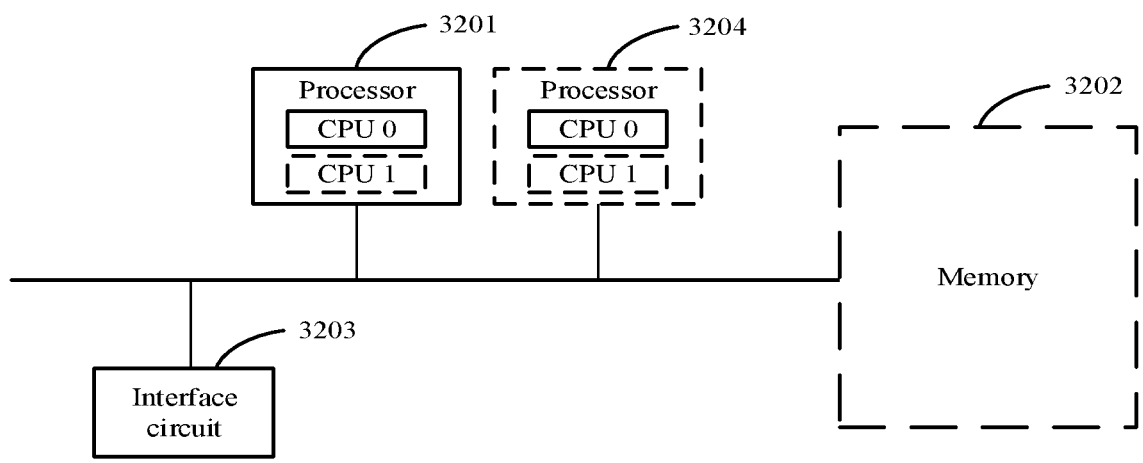
FIG. 32 is a schematic structural diagram of an electronic device control apparatus according to another embodiment of this application.

As shown in FIG. 32, an embodiment of this application provides a schematic diagram of a hardware structure of an electronic device control apparatus.

A test bench control apparatus includes at least one processor (In FIG. 32, an example in which one processor 3201 is included is used for description) and at least one interface circuit 3203 (In FIG. 32, an example in which one interface circuit 3203 is included is used for description.) Optionally, the electronic device control apparatus may further include at least one memory (In FIG. 32, an example in which one memory 3202 is included is used for description).

The processor 3201, the memory 3202, and the interface circuit 3203 are connected through a communications line. The communications line may include a path for transmitting information between the foregoing components.

The processor 3201 may be a general-purpose CPU, a microprocessor, an ASIC, or one or more integrated circuits configured to control program execution of the solutions in this application. In an implementation, in an embodiment, the processor 3201 may alternatively include a plurality of CPUs, and the processor 3201 may be a single-core (single-CPU) processor or a multi-core (multi-CPU) processor. The processor herein may refer to one or more devices, circuits, or processing cores configured to process data (for example, computer program instructions).

The memory 3202 may be an apparatus having a storage function. For example, the memory 3202 may be a read-only memory (ROM) or another type of static storage device that can store static information and instructions, a random access memory (RAM) or another type of dynamic storage device that can store information and instructions, or may be an electrically erasable programmable read-only memory (EEPROM), a compact disc ROM (CD-ROM) or another compact disc storage, an optical disc storage (including a compressed optical disc, a laser disc, an optical disc, a DIGITAL VERSATILE DISC (DVD), a BLU-RAY disc, or the like), a magnetic disk storage medium or another magnetic storage device, or any other medium that can be configured to carry or store expected program code in a form of an instruction or a data structure and that can be accessed by a computer. However, the memory 3202 is not limited thereto. The memory 3202 may exist independently, and be connected to the processor 3201 through the communications line. The memory 3202 may alternatively be integrated with the processor 3201.

The memory 3202 is configured to store computer-executable instructions for executing the solutions in this application, and the processor 3201 controls the execution. In an example, the processor 3201 is configured to execute the computer-executable instructions stored in the memory 3202, to implement the electronic device control method in the embodiments of this application.

Alternatively, optionally, in this embodiment of this application, the processor 3201 may perform a processing-related function in the electronic device control method provided in the following embodiments of this application, and the interface circuit 3203 is connected to other components such as a pressure sensor to implement signal transmission, for example, inputs a drive signal to the pressure sensor and collects a sensor signal output by the pressure sensor. This is not limited in this embodiment of this application.

Optionally, the computer-executable instructions in this embodiment of this application may also be referred to as application program code or computer program code. This is not limited in this embodiment of this application.

In an implementation, in an embodiment, the processor 3201 may include one or more CPUs, for example, a CPU 0 and a CPU 1 in FIG. 32.

In an implementation, in an embodiment, the electronic device control apparatus may include a plurality of processors, for example, a processor 3201 and a processor 3204 in FIG. 32. Each of these processors may be a single-core (single-CPU) processor or a multi-core (multi-CPU) processor. The processor herein may refer to one or more devices, circuits, and/or processing cores configured to process data (for example, computer program instructions).

The processor 3201 in the electronic device control apparatus may invoke the computer-executable instructions stored in the memory 3202, so that the electronic device control apparatus performs the method in the foregoing method embodiments. In an example, functions/implementation processes of the processing module 3102 in FIG. 31 may be implemented by the processor 3201 in the electronic device control apparatus shown in FIG. 32 by invoking the computer-executable instructions stored in the memory 3202.

Functions/implementation processes of the interface module 3101 in FIG. 31 may be implemented by the interface circuit 3203 in the electronic device control apparatus shown in FIG. 32. The electronic device control apparatus provided in this embodiment may be configured to perform the foregoing methods. Therefore, for technical effects that can be obtained by the electronic device control apparatus, refer to the foregoing method embodiments. Details are not described herein again.

Optionally, an embodiment of this application further provides an electronic device control apparatus (for example, the electronic device control apparatus may be a chip or a chip system). The electronic device control apparatus includes a processor, configured to implement the method in any one of the foregoing method embodiments. In a possible design, the electronic device control apparatus further includes a memory. The memory is configured to store necessary program instructions and necessary data. The processor may invoke program code stored in the memory, to instruct the electronic device control apparatus to perform the method in any one of the foregoing method embodiments. Certainly, the memory may alternatively not be in the electronic device control apparatus. When being the chip system, the electronic device control apparatus may include a chip, or may include a chip and another discrete component. This is not limited in this embodiment of this application.

An electronic device provided in an embodiment of this application includes the foregoing display module and the foregoing electronic device control apparatus.

All or some of the foregoing embodiments may be implemented by using software, hardware, firmware, or any combination thereof. When a software program is used to implement the embodiments, all or some of the embodiments may be implemented in a form of a computer program product. The computer program product includes one or more computer instructions. When the computer program instructions are loaded and executed on a computer, the procedures or functions according to the embodiments of this application are all or partially generated. The computer may be a general-purpose computer, a dedicated computer, a computer network, or another programmable apparatus. The computer instructions may be stored in a computer-readable storage medium, or may be transmitted from one computer-readable storage medium to another computer-readable storage medium. The computer-readable storage medium may be any usable medium accessible by the computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like. In the embodiments of this application, the computer may include the apparatuses described above.

Although this application is described with reference to the embodiments, in a process of implementing this application that claims protection, persons skilled in the art may understand and implement another variation of the disclosed embodiments by viewing the accompanying drawings, disclosed content, and the appended claims. In the claims, "comprising" (comprising) does not exclude another component or another step, and "a" or "one" does not exclude a meaning of plurality. A single processor or another unit may implement several functions enumerated in the claims. Some measures are recorded in dependent claims that are different from each other, but this does not mean that these measures cannot be combined to produce a better effect.

Although this application is described with reference to specific features and the embodiments thereof, it is clear that various modifications and combinations may be made to them without departing from the spirit and scope of this application. Correspondingly, the specification and accompanying drawings are merely example description of this application defined by the appended claims, and is considered as any of or all modifications, variations, combinations or equivalents that cover the scope of this application. It is clear that a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. An electronic device control apparatus, comprising:
   an interface circuit configured to:
      input a drive signal to a pressure sensor; and
      collect a sensor signal that is output from the pressure sensor in response to the drive signal; and
   one or more processors coupled to the interface circuit and configured to:
      determine, based on the sensor signal, a pressing time on the pressure sensor;
      generate a control signal for a predetermined function based on the sensor signal, wherein the predetermined function comprises a power key function;
      determine that the power key function is not responding when a pressing time T of the pressure sensor is less than T1;
      generate a sleep signal when the pressing time T of the pressure sensor is greater than T1 but less than T2; and
      generate a power-off or restart signal when the pressing time T of the pressure sensor is greater than T3, wherein $T1<T2<T3$.

2. The electronic device control apparatus of claim 1, wherein the electronic device control apparatus is configured to couple to a display with at least two pressure sensors, and wherein the interface circuit is further configured to generate the control signal for the predetermined function based on the sensor signal received from the at least two pressure sensors.

3. The electronic device control apparatus of claim 1, wherein the one or more processors is further configured to determine the pressure sensor in a predetermined touch area of a display, and wherein the pressure sensor corresponds to the predetermined function.

4. The electronic device control apparatus of claim 1, wherein the one or more processors is further configured to further generate, based on a pressing force on the pressure sensor, a second control signal for a second predetermined function, and wherein the second predetermined function is controlling a volume control function for a volume increase or a volume decrease.

5. The electronic device control apparatus of claim 1, wherein the one or more processors is further configured to generate, based on the sensor signal, an invoking signal for invoking a predetermined application.

6. An electronic device control method, comprising:
   inputting a drive signal to a pressure sensor;
   collecting a sensor signal that is output from the pressure sensor in response to the drive signal;
   determining, based on the sensor signal, a pressing time on the pressure sensor or a pressing force on the pressure sensor;
   generating a control signal for a predetermined function based on the sensor signal, wherein the predetermined function comprises a power key function;
   determining that the power key function is not responding when a pressing time T of the pressure sensor is less than T1;
   generating a sleep signal when the pressing time T of the pressure sensor is greater than T1 but less than T2; and
   generating a power-off or restart signal when the pressing time T of the pressure sensor is greater than T3, wherein $T1<T2<T3$.

7. The electronic device control method of claim 6, wherein the generating comprises further generating the control signal for the predetermined function based on sensor signals received from at least two pressure sensors of a display coupled to an electronic device control apparatus.

8. The electronic device control method of claim 6, wherein before the inputting and the collecting, the electronic device control method further comprises determining the pressure sensor in a predetermined touch area of a display, and wherein the pressure sensor corresponds to the predetermined function.

9. The electronic device control method of claim 6, further comprising generating a second control signal for a second predetermined function based on the pressing force on the pressure sensor, and wherein the second predetermined function comprises controlling a volume control function for a volume increase or a volume decrease.

10. The electronic device control method of claim 6, wherein the generating comprises generating, based on the sensor signal, an invoking signal for invoking a predetermined application.

11. An electronic device control apparatus, comprising:
    a memory configured to store computer-executable instructions; and
    one or more processors coupled to the memory and configured to execute the computer-executable instructions to cause the electronic device control apparatus to:
       input a drive signal to a pressure sensor;
       collect a sensor signal that is output by the pressure sensor in response to the drive signal;
       determine, based on the sensor signal, a pressing time on the pressure sensor or a pressing force on the pressure sensor;
       generate a control signal for a predetermined function based on the sensor signal, wherein the predetermined function comprises a power key function;
       determine that the power key function is not responding when a pressing time T of the pressure sensor is less than T1;
       generate a sleep signal when the pressing time T of the pressure sensor is greater than T1 but less than T2; and generate a power-off or restart signal when the pressing time T of the pressure sensor is greater than T3, wherein T1<T2<T3.

12. A computer program product comprising a non-transitory computer-readable storage medium comprising computer-executable instructions that, when executed by one or more processors of a computer, cause the computer to:
input a drive signal to a pressure sensor;
collect a sensor signal that is output by the pressure sensor in response to the drive signal;
determine, based on the sensor signal, a pressing time on the pressure sensor or a pressing force on the pressure sensor;
generate a control signal for a predetermined function based on the sensor signal, wherein the predetermined function comprises a power key function;
determine that the power key function is not responding when a pressing time T of the pressure sensor is less than T;
generate a sleep signal when the pressing time T of the pressure sensor is greater than T1 but less than T2; and
generate a power-off or restart signal when the pressing time T of the pressure sensor is greater than T3, wherein T1<T2<T3.

13. A non-transitory computer-readable storage medium comprising a computer-program product that when executed by one or more processors of a computer, cause the computer to:
input a drive signal to a pressure sensor;
collect a sensor signal that is output by the pressure sensor in response to the drive signal; and
generate a control signal for a predetermined function based on the sensor signal, wherein the predetermined function comprises a power key function;
determine that the power key function is not responding when a pressing time T of the pressure sensor is less than T1;
generate a sleep signal when the pressing time T of the pressure sensor is greater than T1 but less than T2; and
generate a power-off or restart signal when the pressing time T of the pressure sensor is greater than T3, wherein T1<T2<T3.

14. The non-transitory computer-readable storage medium of claim 13, wherein the computer-program product that when executed by the one or more processors of the computer, cause the computer to:
couple to a display system with the pressure sensor; and
generate the control signal for the predetermined function based on the sensor signal received from the pressure sensor.

15. The non-transitory computer-readable storage medium of claim 13, wherein the computer-program product that when executed by the one or more processors of the computer, cause the computer to determine the pressure sensor in an active area of a display system, and wherein the pressure sensor corresponds to the predetermined function.

16. The non-transitory computer-readable storage medium of claim 13, wherein the computer-program product that when executed by the one or more processors of the computer, cause the computer to determine the pressure sensor in a predetermined touch area of a display, and wherein the pressure sensor corresponds to the predetermined function.

17. The non-transitory computer-readable storage medium of claim 13, wherein the computer-program product that when executed by the one or more processors of the computer, cause the computer to generate, based on a pressing force on the pressure sensor, a second control signal for a second predetermined function, and wherein the second predetermined function is controlling a volume control function for a volume increase or a volume decrease.

18. The non-transitory computer-readable storage medium of claim 13, wherein the computer-program product that when executed by the one or more processors of the computer, cause the computer to generate, based on the sensor signal, an invoking signal for invoking a predetermined application.

19. The electronic device control apparatus of claim 11, wherein the one or more processors are configured to execute the computer-executable instructions to further cause the electronic device control apparatus to generate the control signal for the predetermined function based on the sensor signal received from at least two pressure sensors.

20. The electronic device control apparatus of claim 11, wherein the one or more processors are configured to execute the computer-executable instructions to further cause the electronic device control apparatus to determine the pressure sensor in a predetermined touch area of a display, and wherein the pressure sensor corresponds to the predetermined function.

* * * * *